(12) United States Patent
Mook

(10) Patent No.: US 7,081,584 B2
(45) Date of Patent: Jul. 25, 2006

(54) SOLAR BASED ELECTRICAL ENERGY GENERATION WITH SPECTRAL COOLING

(76) Inventor: William J. Mook, 291 Oxford Oak, Blacklick, OH (US) 43004

( * ) Notice: Subject to any disclaimer, the term of this patent is extended or adjusted under 35 U.S.C. 154(b) by 0 days.

(21) Appl. No.: 10/656,710

(22) Filed: Sep. 5, 2003

(65) Prior Publication Data
US 2005/0051205 A1 Mar. 10, 2005

(51) Int. Cl.
*H01L 31/052* (2006.01)

(52) U.S. Cl. ............... 136/246; 136/259; 136/255; 136/249; 136/252; 136/262; 136/251; 136/244; 136/261; 257/436; 257/432; 257/461; 257/443; 257/465; 126/683; 126/685; 126/698; 126/688

(58) Field of Classification Search ........... 136/246, 136/259, 255, 249, 252, 261, 262, 251, 244; 257/436, 432, 461, 443, 465; 126/683, 685, 126/698, 688
See application file for complete search history.

(56) References Cited

U.S. PATENT DOCUMENTS

| | | | |
|---|---|---|---|
| 3,018,313 A * | 1/1962 | Gattone | 136/246 |
| 3,186,873 A | 6/1965 | Dunlap | |
| 3,923,381 A * | 12/1975 | Winston | 359/852 |
| 4,082,570 A * | 4/1978 | House et al. | 136/246 |
| 4,115,149 A * | 9/1978 | Bell | 136/259 |
| 4,301,321 A * | 11/1981 | Bartels | 136/246 |
| 4,350,837 A * | 9/1982 | Clark | 136/246 |
| 4,633,030 A * | 12/1986 | Cook | 136/246 |
| 4,643,524 A | 2/1987 | Mori | |
| 4,927,770 A * | 5/1990 | Swanson | 438/83 |
| 5,089,055 A * | 2/1992 | Nakamura | 136/248 |
| 5,118,361 A * | 6/1992 | Fraas et al. | 136/246 |
| 5,154,777 A * | 10/1992 | Blackmon et al. | 136/245 |
| 5,404,869 A * | 4/1995 | Parkyn et al. | 126/699 |
| 6,015,950 A * | 1/2000 | Converse | 136/246 |
| 6,057,505 A * | 5/2000 | Ortabasi | 136/246 |
| 6,384,320 B1 * | 5/2002 | Chen | 136/259 |
| 6,469,241 B1 * | 10/2002 | Penn | 136/246 |
| 6,653,551 B1 * | 11/2003 | Chen | 136/246 |
| 6,661,818 B1 * | 12/2003 | Feldman et al. | 372/32 |
| 6,717,045 B1 * | 4/2004 | Chen | 136/246 |
| 6,881,893 B1 * | 4/2005 | Cobert | 136/246 |
| 2005/0092360 A1 * | 5/2005 | Clark | 136/259 |
| 2005/0166952 A1 * | 8/2005 | Ransquin et al. | 136/246 |

OTHER PUBLICATIONS

Martf et al, High efficiency photovoltaic conversion with spectrum splitting on GaAs and Si Cells in light confining cavities, IEEE (1993), pp. 768-773.*

Lewis et al, "Multi-Bandgap High Efficiency Converter (Rainbow)", Proceedings of the 32nd Intersociety Energy Conversion Engineering Conference, IECEC-97, vol. 1, pp. 401-406, Jul. 27 to Aug. 1, 1997.*

"Fabry-Perot interferometer", http://en.wifipedia.org/eiki/Etalon, printed Sep. 1, 2005.*

* cited by examiner

*Primary Examiner*—Alan Diamond
(74) *Attorney, Agent, or Firm*—Mueller and Smith, LPA

(57) ABSTRACT

Method and system for converting solar energy into electrical energy utilizing serially coupled multijunction-type photovoltaic cells in conjunction with a form of spectral cooling. The latter cooling is carried out by removing ineffective solar energy components from impinging concentrated light, inter alia, through the utilization of dichroics or the conversion of ineffective solar energy components to effective energy components by means of luminescence, phosphorescence, or fluorescence. Ineffective solar energy components are described as those exhibiting wavelengths outside the bandgap energy defined wavelength and an associated wavelength defined band of useful photon energy.

37 Claims, 14 Drawing Sheets

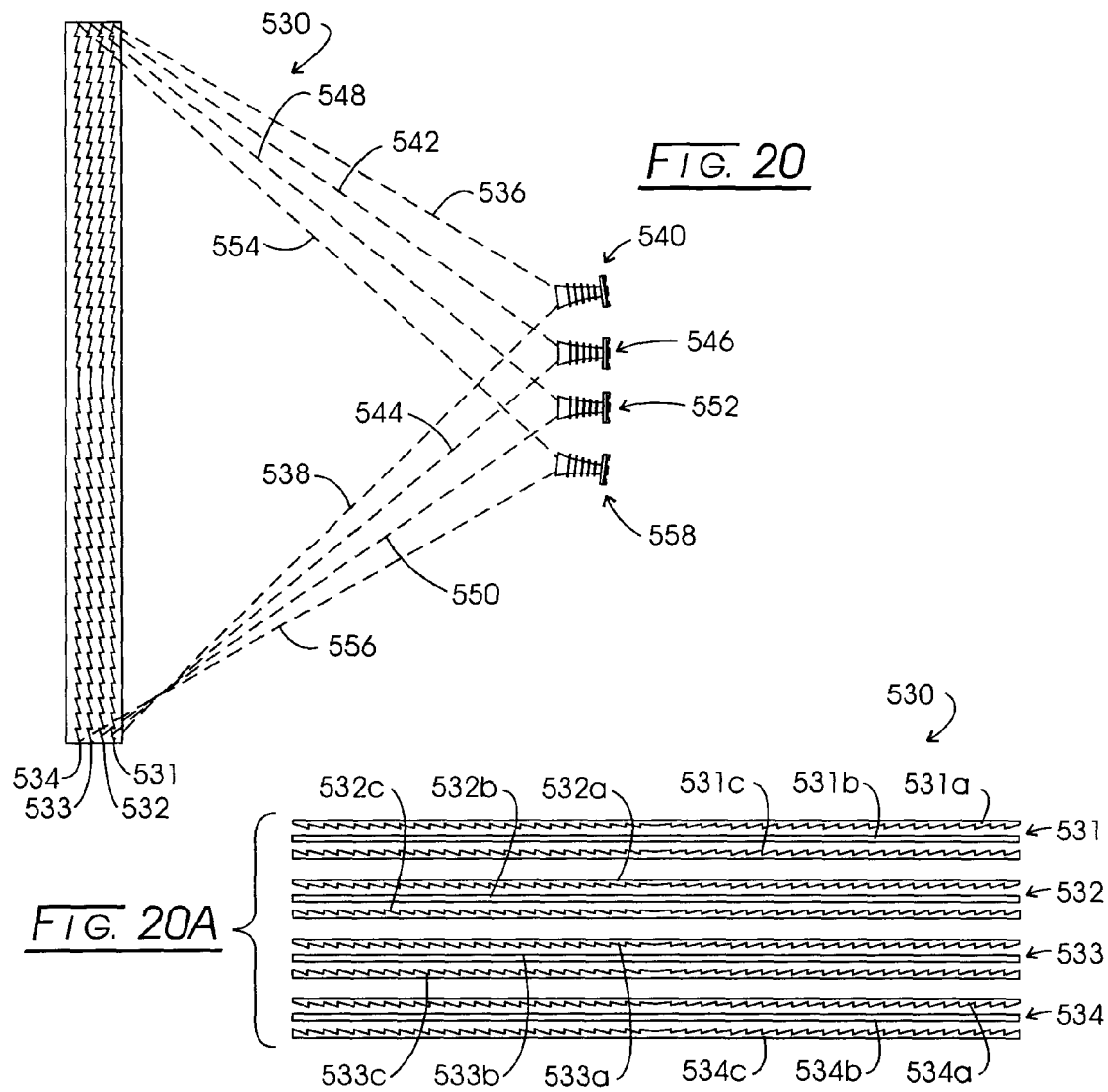
FIG. 20
FIG. 20A
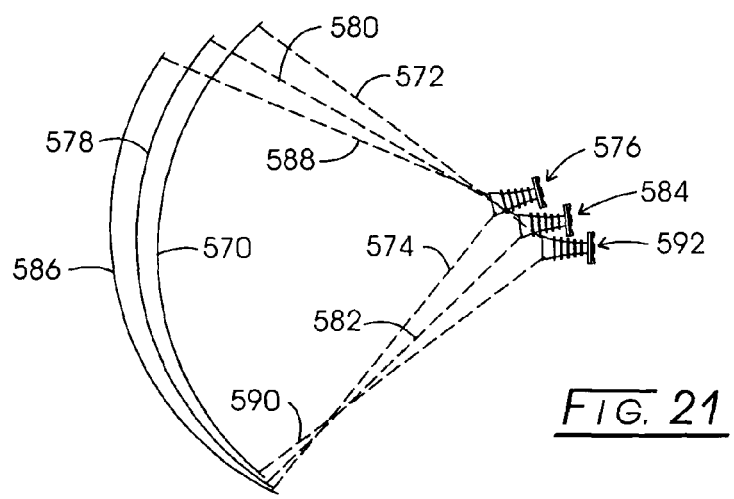
FIG. 21

SOLAR BASED ELECTRICAL ENERGY GENERATION WITH SPECTRAL COOLING

CROSS-REFERENCE TO RELATED APPLICATIONS

STATEMENT REGARDING FEDERALLY SPONSORED RESEARCH

Not applicable.

BACKGROUND OF THE INVENTION

The conversion of solar energy into electrical energy utilizing photovoltaic devices historically has been considered to have only marginal utility. Early and current plate-type devices were somewhat small, non-concentrating and non-suntracking. Thus, their employment has been limited to remote applications, for example, recharging the batteries of control devices and the like at locations where conventional line power is not available. Considered on a cost per watt basis (about $6.00 per watt to about $8.00 per watt) their form of power generation is quite expensive.

In 1973, with the advent of the oil crisis, government funded efforts were undertaken to develop alternate energy sources including concentration-based photovoltaic systems and the harnessing of wind. While the technology for developing wind conversion systems was sufficient to make them ultimately practical, photovoltaic system technology lagged. However, several large-scale demonstration products were developed.

As the energy crisis passed and oil prices lowered, concentrator-based photovoltaic programs diminished. At the present time, while important improvements in concentrator-based photovoltaic systems have been developed, the cost of power generation produced by them remains non-competitive with fossil fuel-based generation. In 2000, a leading concentration-based photovoltaic investigator stated:

> In reaching for the ultimate goal of providing clean, renewable energy, concentrators compete head-on with existing fossil fuel-fired generators. Projected electricity costs from concentrator power plants are about three times the current cost of energy from natural gas power plants. Early concentrator plants will be twice as expensive again. There is nothing that can be done about this without government involvement, period. We need to decide as a society if environmental issues such as acid rain, global warming, and reduced health are important enough to subsidize this difference for a while. Richard M. Swanson, "The Promise of Concentrators", Prog. Photovolt. Res. Appl. 8, 93–111 (2000).

One of the more interesting innovations in the photovoltaic arena has been the introduction of the high voltage silicon vertical multijunction (VMJ) solar cell. Sometimes referred to as an "edge-illumination" multijunction cell, the VMJ cell is an integrally bonded series-connected array of miniature silicon vertical junction cell units. This series connection aspect overcomes the low voltage characteristic of the cells. The devices were developed by a NASA scientist, Bernard L. Sater at the NASA Glen Research Center. They are described in U.S. Pat. No. 4,332,973 entitled "High Intensity Solar Cell", issued Jun. 1, 1982 by Sater; U.S. Pat. No. 4,409,422 entitled "High Intensity Solar Cell", issued Oct. 11, 1983 by Sater; and U.S. Pat. No. 4,516,314 entitled "Method of Making a High Intensity Solar Cell", issued May 14, 1985 by Sater, which patents are incorporated herein by reference.

In consequence of the VMJ topology where several junctions are stacked on top of one another, a resulting voltage will be equal to the voltage of each junction times the number of junctions (N). Thus, energy for a given current is reduced by the factor, N, and the parasitic power losses are reduced by a factor of, $N^2$. For example, where a VMJ is configured with forty junctions, the parasitic losses will be reduced by the factor 1/1600. This means that the cells can react to concentration solar intensities up to about 1600 times solar intensity of that of conventional cells operating at the same power level. It is this reduction in parasitic losses which permits the noted increase in the concentration levels at which such cells can operate and which thus further achieves a cost reduction in energy generation. As an example of the cells performance, a 0.78 $cm^2$ VMJ cell with forty series connected junctions produced 31.8 watts at 25.5 volts at nearly 2500 suns AM1.5 intensities in flash tests at the NASA Glen Research Center. That demonstrates a VMJ cell output power density of 40.4 watts/$cm^2$ with an estimated input of 211 watt/$cm^2$ and an efficiency near 20%. The Arizona Public Service Company has used the cell in a 100 kW installation at the Glendale Arizona Municipal Airport. Further uses of the cells are underway in Australia.

Another innovation in concentration photovoltaic devices has been evolved in connection with the SunPower Corporation of Sunnyvale, Calif. In the 1980s, R. M. Swanson (supra) proposed a point contact solar cell capable of performing with concentrators. To accommodate the above-noted low voltage aspects of photovoltaic devices, multiple junctions of these small area cells are arranged in series in a monolithic semiconductor substrate. Such devices currently are referred to as "back surface point contact silicon solar cells". The cells and their manufacture are described, for instance, in the following U.S. Patents which are incorporated herein by reference: U.S. Pat. No. 4,927,770 by Swanson, entitled "Method of Fabricating Back Surface Point Contact Solar Cells", issued May 22, 1990; U.S. Pat. No. 5,164,019 by Sinton entitled "Monolithic Series-Connected Solar Cells Having Improved Cell Isolation and Method of Making Same", issued Nov. 17, 1992; U.S. Pat. No. 6,274,402 by Verlinden et al., entitled "Method of Fabricating a Silicon Solar Cell", issued Aug. 14, 2001; U.S. Pat. No. 6,313,395 by Crane et al., entitled "Interconnect Structure for Solar Cells and Method of Making Same", issued Nov. 6, 2001; and U.S. Pat. No. 6,333,457 by Mulligan et al., entitled "Edge Passivated Silicon Solar/Photo Cell and method of Manufacture", issued Dec. 25, 2001.

See additionally the following publications:

Verlinden et al., "Backside-Contact Silicon Solar Cells With Improved Efficiency for the '96 World Solar Challenge", Proceedings of the $14^{th}$ EC Photovoltaic Solar Energy, Barcelona, Jun. 30–Jul. $4^{th}$, 1997, pp 96–99.

Mulligan et al., "A Flat-Plate Concentrator: Micro-Concentrator Design Overview, Proceedings $28^{th}$ EEE PVSC, 2000.

Endeavors also have been witnessed which are concerned with multijunction cell design utilizing a combination of Perodic III-V semiconductor materials to capture an expanded range of photon energies. One concept in this regard has been to split the impinging spectrum to photovoltaicly engage semiconductor materials somewhat optimized to a split-off spectral band. An approach considered more viable has been to grow multiple layers of semiconductors with decreasing band gaps. Top layers of these devices are designed to absorb higher energy photons while transmitting lower energy photons to be absorbed by lower layers of the cell. For example, the National Renewable Energy Laboratory (NREL) design of a GaInP/GaAs/Ge triple-junction solar cell design has been reported achieving a conversion efficiency of 34% under concentrated light.

See generally, the online document by B. Burnett: www.nrel.gov\ncpv\pdfs\11_20_dga basics_9–13.pdf In general, there are difficulties with the latter multi-spectral approach particularly associated with lattice-constant constraint and current matching. In the latter regard, the output current of the multijunction solar cells is limited to the smallest of the currents produced by any of the individual junctions. For this reason all junctions in the monolithic device must be designed to produce the same amount of photo current.

Among the drawbacks remaining associated with current concentration photovoltaic systems is the heat build-up occasioned by their relatively lower efficiencies. That heat is the result of ineffective photonic interaction with the cells, i.e., only a portion of the concentrated solar energy is converted at their depletion layers into useful energy, the rest being absorbed as heat throughout the cell. Further, the cells must be operated under restrictive temperature limits. While heat sinking is utilized to combat heat build-up, there are limits to heat sinking capabilities. Passively (convectional) cooled heat sinks have a heat sink limit of about forty watts/cm$^2$, while active (water cooled) heat sinking has a heat sink limit of about eighty watts/cm$^2$.

BRIEF SUMMARY OF THE INVENTION

The present invention is addressed to method and system for deriving an electrical output from solar radiation. Utilizing either the series coupled multijunction photovoltaic cell or series configured point contact solar cells (collectively referred to as "series-connected arrays of photovoltaic cells"), output performance is significantly advanced through the utilization of a technique termed "spectral cooling". This technique recognizes that each form of photovoltaic material exhibits a unique wavelength defined bandgap energy and further associates that bandgap energy characteristic with a unique wavelength defined band of useful photon energy wherein a substantial amount of efficient photon-depletion layer interaction is achieved. In general, that band extends rearwardly, or toward shorter wavelengths, to about one half of the value of the wavelength at bandgap energy. By removing wavelengths above and below the band of useful wavelengths, ineffective solar energy components (ISEC) are substantially eliminated with their attendant heat generating attributes. As a consequence, a substantially more beneficial use may be made of heat sinking practices associated with the series-connected arrays of photovoltaic cells to the extent that greater solar concentrations are realized with concomitantly more efficient electrical energy generation.

Spectral cooling may be carried out employing a variety of techniques, for instance, using reflective and/or transmissive dichroics, or frequency shifting with luminescence, phosphorescence or fluorescence phenomena.

The performance of series-connected arrays of photovoltaic cells further is improved by carrying out a homogenization of the spectrally corrected light paths to assure a distribution of light of uniform intensity at their light receiving surfaces. In one embodiment, such homogenization is realized with non-imagining secondary concentrators which are somewhat horn-shaped, receiving focused light at their broader entrance ends and internally reflecting that light progressively toward their smaller exits. By incorporating dichroic internal reflecting components within the secondary concentrators they may further function for purposes of spectral cooling. In this regard, the ineffective solar energy components and associated kinetic energy are disbursed into the secondary concentrator itself and away from the photovoltaics.

The system and method also look to the utilization of multiple, series couple arrays of photovoltaic cells wherein each array exhibits a correspondingly unique wavelength defined bandgap energy and wavelength defined band of useful photon energy. With this approach, spectral cooling is carried out with respect to each unique wavelength defined band of useful photon energy. In certain embodiments of this multi-spectral approach, dichroics are combined with more than one primary concentrator component to achieve spectral cooling. By slightly offsetting these primary concentrator components, unique, separated corrected concentration light paths are developed for discrete homogenization and impingement upon the receiving surfaces of the unique photovoltaic devices.

An improvement is presented with respect to the vertical multi-junction solar cell (VMJ). In this regard, the stack angle of the multiple junctions is tilted with respect to their receiving surface, preferably at a Brewster's angle. That angulated junction arrangement then permits an improved photon absorption efficiency at the depletion layers.

The primary concentrators may be manifested as Fresnel mirrors of relatively large size, for example, exhibiting a rectangular periphery of about fifty feet on a side. For tracking purposes, these large mirror structures are mounted upon a carriage assembly which, in turn, is rotatably mounted upon a horizontal rail assembly. The lower edge of the mirror is mounted for pivotal movement upon the carriage between an upright orientation and a generally horizontal one. Thus, solar tracking may be carried out. As an additional advantage, the large flat primary concentrator structure may be lowered to a horizontal orientation protecting it from wind damage under conditions of otherwise encountered high wind loads.

Other objects of the invention will, in part, be obvious and will, in part, appear hereinafter.

The invention, accordingly, comprises the method and system possessing the construction, combination of elements, arrangement of parts and steps which are exemplified in the following detailed description.

For a fuller understanding of the nature and objects of the invention, reference should be made to the following detailed description taken in connection with the accompanying drawings.

BRIEF DESCRIPTION OF THE DRAWINGS

FIG. 20 is a schematic representation of a multi-spectral Fresnel structure primary concentrator with ISEC component removal and bandgap energy matching;

FIG. 20A is an exploded schematic view of the primary concentrator of FIG. 20;

FIG. 21 is a schematic view showing three offset parabolic primary concentrators with ISEC component removal and showing offset bandgap energy matched secondary concentrators and photovoltaic arrays.

DETAILED DESCRIPTION OF THE INVENTION

The instant solar conversion method and system makes advantageous use of the serially associated multijunction photocells as described above. These structures contribute importantly in the utilization of concentrated solar energy. The advantage of the series coupled solar cells is evidenced in FIG. 1. In that figure, the relative electrical output versus light intensity for a conventional photocell is represented at dashed curve 10. For such devices, as light intensity increases so does power output, but in a solar cell this results only in current increases. Increased current means increased heating and heating increases as the square of the current. Such increased heating results in lower efficiencies and lower efficiencies, in turn, result in lower power output for a given level of illumination. When losses in efficiency become greater than increases in solar intensity, then overall output peaks. In conventional solar cells, peak output is achieved at about 2.15 times normal solar intensity.

Figure 1:
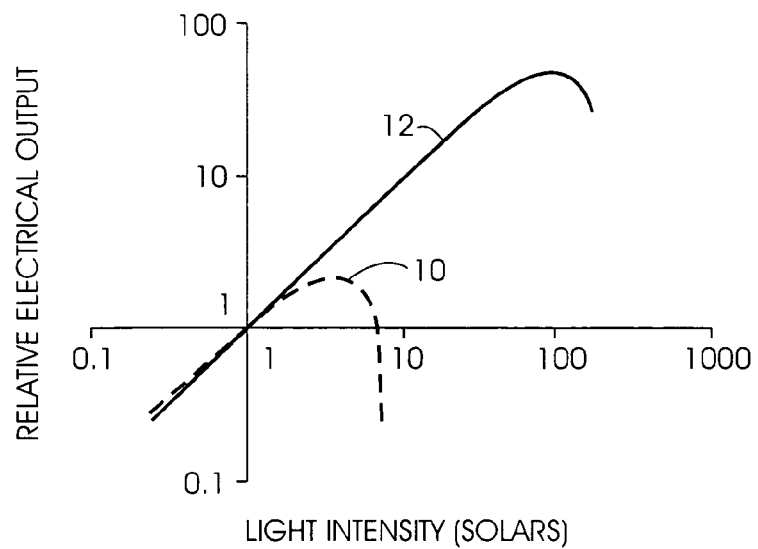
FIG. 1 is a graph showing relative electrical output of conventional and series coupled multijunction photovoltaic cell arrays with respect to light concentration.

The series coupled arrayed solar cells are capable of more efficiently handling larger current with less heating or operate at higher voltage and so produce more power with less current. Losses can be reduced and peak output attained at higher light intensity. Curve 12 of FIG. 1 illustrates the impact of being able to reduce the current induced losses by up to 1/200 that of typical solar cells. Curve 12 represents an array of series coupled solar cells that consists of either fifteen junctions or possesses 1/200 the internal resistance of a conventional cell.

Figure 2:
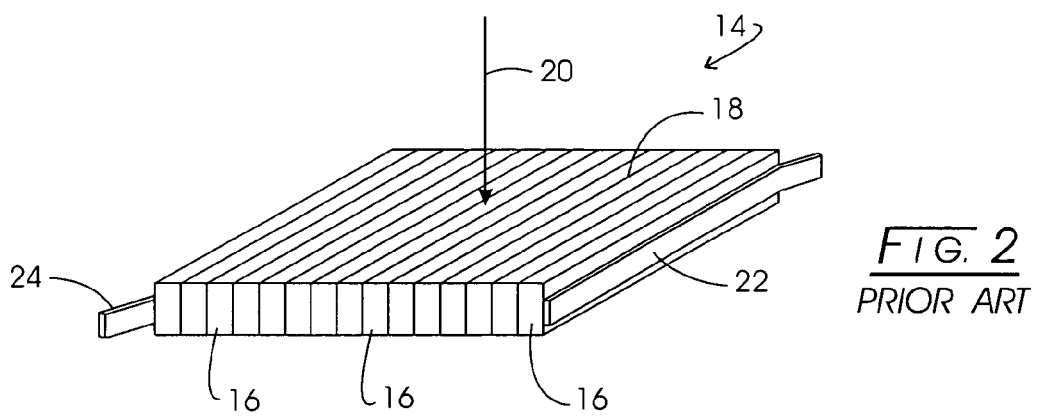
FIG. 2 is a schematic pictorial representation of a vertical serially coupled multijunction photovoltaic cell array.

A vertical multijunction cell (VMJ) is represented schematically and in general at 14 in FIG. 2. Cell 14 is configured with a series connected array of junction unit cells certain of which are represented schematically at 16. Cells 16 are seen to have a "vertical" stack orientation and thus provide a multijunction defined edge illumination receiving surface 18. A perpendicular direction of solar impingement upon the receiving surface 18 is represented at arrow 20. Oppositely disposed terminals 22 and 24 are seen electrically coupled with the outboard surfaces of the array cell 16. The VMJ cells are fabricated, for example, having forty diffused $p^+$ $nn^+$ silicon wafers of 250 microns thickness which are metalized, stacked and alloyed together to form a multi-layer stack that is about 1 cm high. This stack of diffused wafers, when appropriately cut, will yield about 1000 VMJ cells of 1 cm×1 cm×0.05 cm size each containing forty series connected unit cells for higher voltage operation.

The testing of VMJ cells at high solar intensities has been described as posing challenges. As with any solar cell with series connected junctions, light uniformity to each cell in series is needed because the lowest current cell will essentially limit the overall output current.

Figure 3:
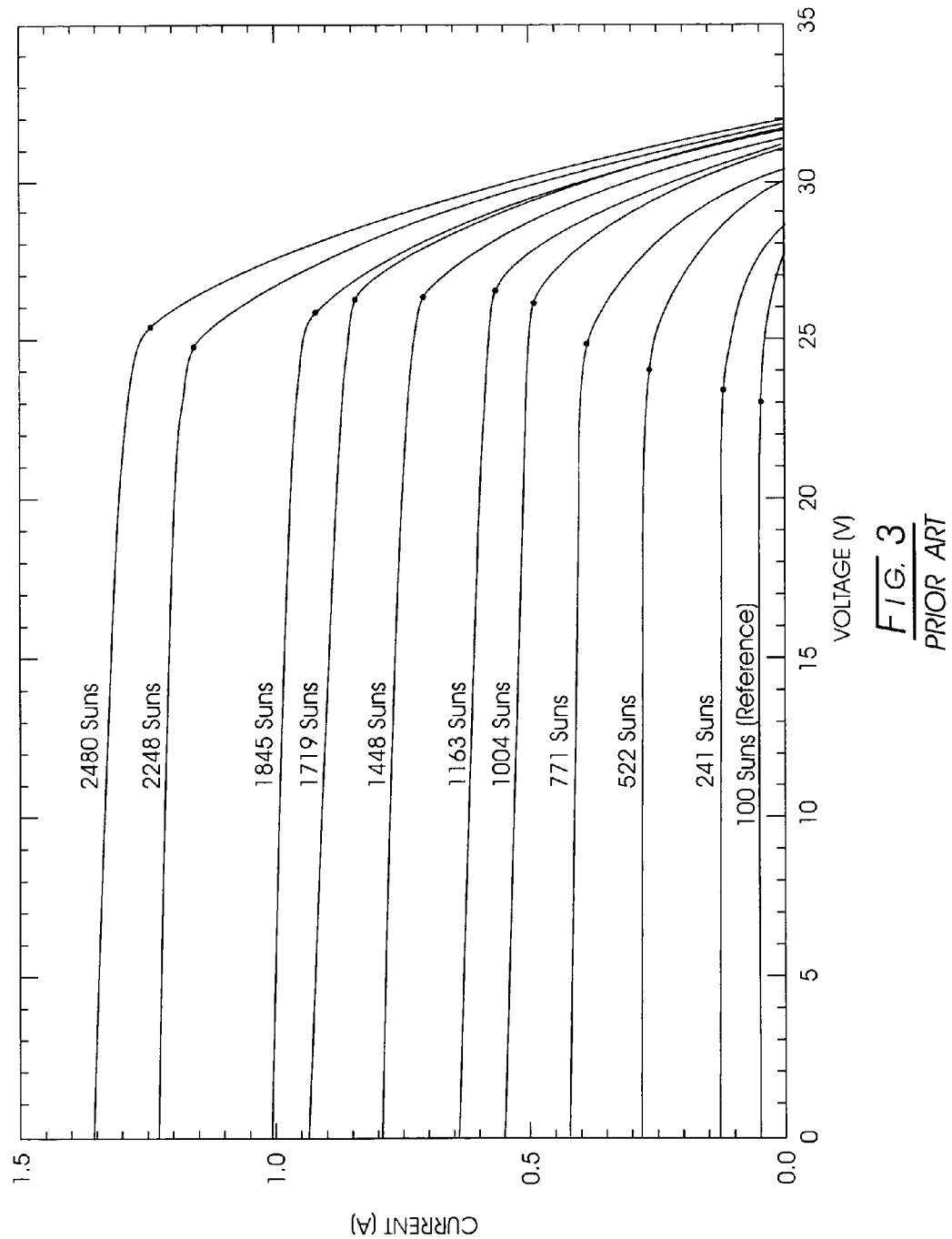
FIG. 3 is a schematic pictorial representation of series connected back surface point contact solar cells.

Referring momentarily to FIG. 3, high intensity flash test results utilizing the NASA Space LAPSS/simulator are represented. For deriving these curves a VMJ cell containing forty series junctions with an area of 0.78 cm square was employed. Generally referred to as "IV" data (current-voltage) the data shows efficiency peaks at about 1200 suns AM1.5 intensity (about 100 watts input per $cm^2$) with an efficiency of 19.48%. Peak power is represented on the curves as a dot.

Figure 4:
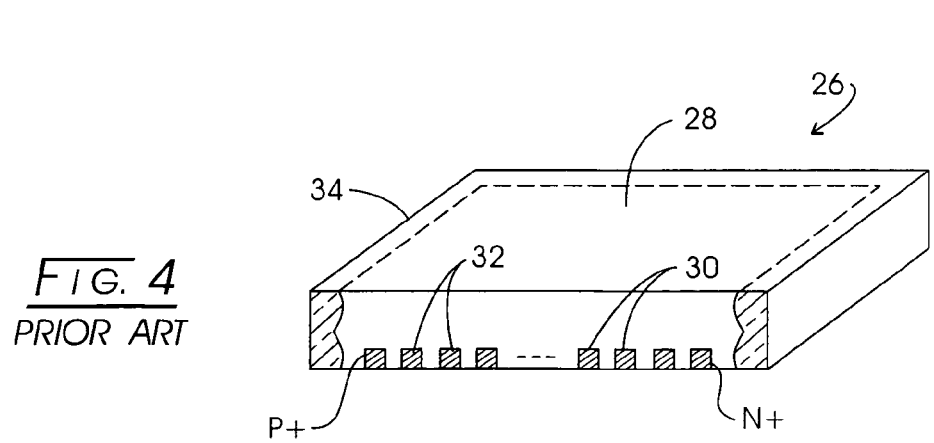
FIG. 4 is a VI sequence of curves for a vertical multi-junction photovoltaic cell array with respect to a sequence of solar intensities.

Referring to FIG. 4, a point contact solar cell is schematically portrayed in general at 26. Cell 26 is fabricated in a silicon die 28 with two opposing major surfaces with the surface area being on the order of 4 mm². The die 28 is an intrinsic monocrystalline silicon chip. A pattern of p+ doped regions 30 and n+ doped regions 32 are formed in one surface in a repetitive pattern of interleaved rows. The p+ rows and the n+ rows are interconnected to form the contacts for the solar cell. A repetitive pattern is derived for the diffused regions, with each pattern or cell separated from adjacent cells by streets or space for eventual sawing of the substrate and forming of individual dies. Prior to the cell fabrication in the substrate, dopant is diffused through the substrate 28 in the channels, thereby forming passivation regions as represented at 34. See generally U.S. Pat. No. 6,333,457 (supra).

While solar conversion cells as at 14 and 26 enjoy greater power generating capabilities, when implemented in silicon, they are constrained to operate within a maximum temperature of about 65° C. As noted above, heat sinking, whether passive or active also is limited such that their output is constrained by a need for practical thermal control.

Figure 5:
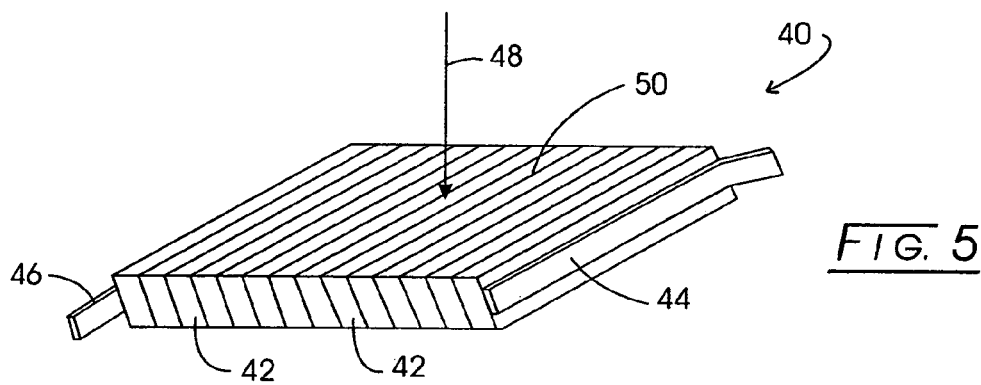
FIG. 5 is a pictorial schematic representation of an angled serially coupled multijunction photovoltaic cell array according to the invention.
Figure 5A:
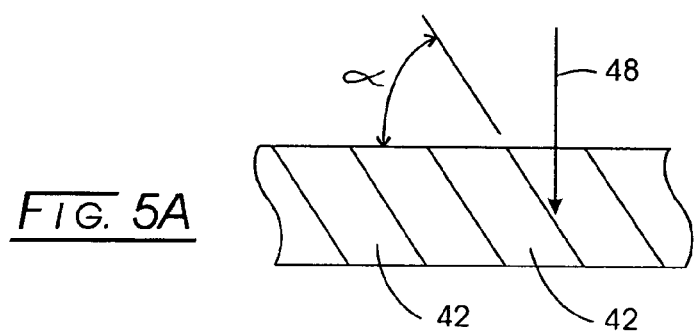
FIG. 5A is a partial sectional view of the array of FIG. 5 showing the angular orientation with respect to the junction in connection with a ray trace extending perpendicularly to the devices' receiving surface.

An initial aspect of the present invention resides in the improvement of the absorption efficiency of VMJ type cells as at 14. Referring to FIG. 5, a multijunction photovoltaic cell is represented in general at 40. Cell 40 is schematically represented as having a series connected array of junction unit cells certain of which are shown at 42. These series arrayed cells 42 are, as before, interconnected between oppositely disposed terminals 44 and 46. Solar energy is represented at arrow 48 again impinging upon a multijunction defined edge illumination receiving surface 50. Note, however, in the instant embodiment the stack orientation of the cells 42 is disposed at a stack angle with respect to the plane of its illumination receiving surface. This stack angle is represented at α min FIG. 5A. Preferably the angle, α, is Brewster's angle the value of which will be dependent upon the indices of refraction involved. However, a variety of stack angles can be employed to improve photon absorption efficiency by encouraging internal reflection and resultant depletion layer/photon interaction activity. In general photocell 40 is referred to as an "angle multijunction cell" (AMJ).

Figure 6:
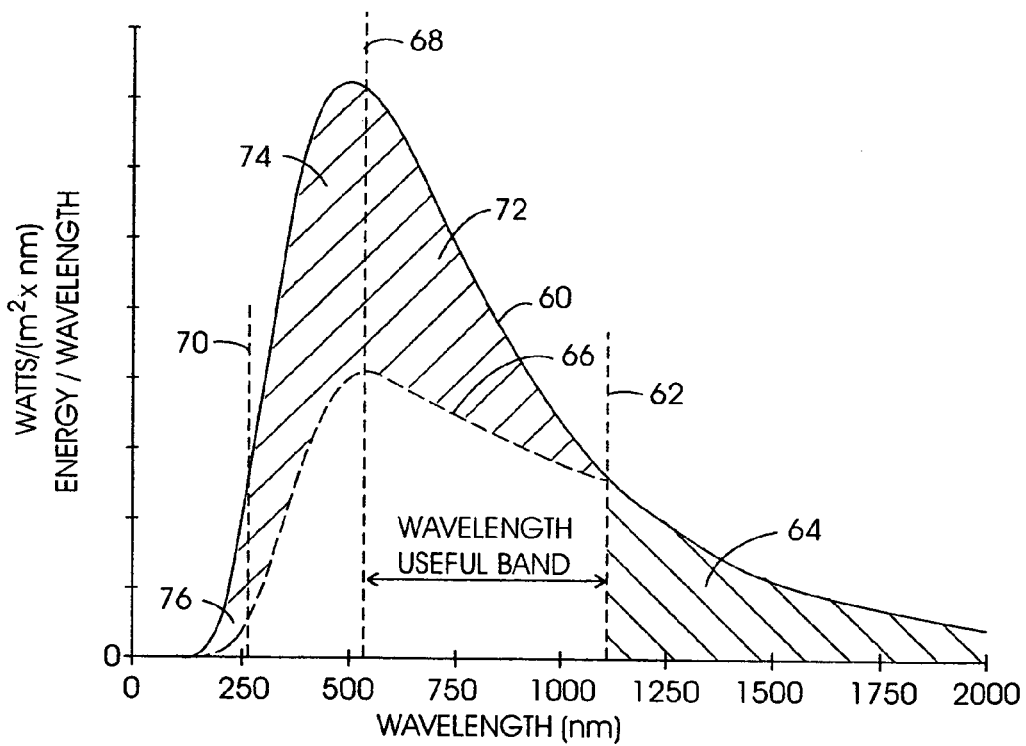
FIG. 6 is a Planck curve showing bandgap energy locations for a silicon photovoltaic cell and illustrating a useful wavelength band for spectral cooling according to the invention.

Now looking to the aspects of heat generation by the multijunction cell arrays, it may be observed that the sun may be considered to be a black body radiating at about 5800° Kelvin (at earth). In general, radiation may be considered in terms of energy per wavelength, following the Planck curve of emission of light. Looking to FIG. 6, such a Planck curve is schematically represented at 60. In general, the curve 60 relates electrical energy to wavelength energy following Planck's formula which may be represented as follows:

$$E = \hbar/\lambda$$

where $\hbar$ is Planck's constant divided by $2\pi$. In general, the ordinate of curve 60 may be represented as energy per wavelength or watts/(m²×nm) and the abscissa represents wavelength in nanometers. In general, Planck's formula represents that, as wavelengths become smaller, the energy in the associated photons grows greater. However, bandgap energy remains constant. It may be further observed that the circuit associated with a given photovoltaic cell can absorb bandgap energy. For silicon devices, that bandgap energy (BGE) is present at 1100 nanometers as represented by vertical dashed line 62 in the figure. Accordingly, for such devices, the energy represented at longer wavelengths and illustrated in crosshatched fashion at 64 is too weak and is manifested within the photovoltaic device as heat.

On the other hand, as the wavelength shortens, photon energy increases and photons which may be absorbed in the depletion layer to contribute to electrical production will fall below internal dashed curve 66. Note that curve 66 somewhat peaks at one-half the value of wavelength representing bandgap energy at dashed line 62. This halfway point is represented at vertical dashed line 68 which extends from 550 nanometers wavelength. Halving that wavelength again results in a 275 nanometer wavelength represented at vertical dashed line 70. As is apparent, between vertical dashed lines 68 and 70 very little useful energy is available for the generation of electrical output, photons, in effect, being transmitted through the photovoltaic device to create heat. Hatched areas 72 74, and 76 reveal very little effective depletion layer generated energy. In accordance with the method of the invention, the wavelengths between bandgap energy line 62 and about one-half of the associated wavelength at line 68 is considered a band of useful wavelengths. In this regard, while that region contains non-usable photon energies as represented at hatched region 72, by restricting operation of the photocell in effect between lines 62 and 68, a substantial amount of heat generation energy is avoided. In effect, a "spectral cooling" can be achieved. The method of the invention will be seen to remove components of solar energy at a concentration light path which corresponds with at least a portion of those wavelengths substantially ineffective to evoke cell electrical output. With the arrangement, greater concentration of sun radiation may be employed in the generation of electrical energy by virtue of this spectral cooling approach.

Figure 7A:
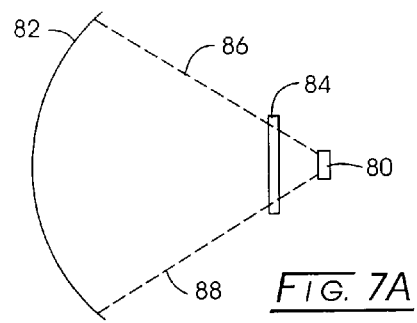
FIG. 7A–7F show a sequence of geometric ray trace configurations for utilizing dichroic components in accordance with the invention.

A variety of approaches can be utilized for the removal of ineffective solar energy components (ISEC) as represented at cross hatch curve regions 64, 70, 72, 74 and 76. For example, dichroics, either reflective or transmissive may be employed. Additionally, frequency shifting may be carried out with luminescence, phosphorescence or fluorescence. Considering conventional heat sinking constraints as described above, electricity generation efficiencies can alter from about a conventional 10% of useful energy to about 70% of useful energy FIGS. 7A–7F schematically illustrate a variety of dichroic configurations for carrying out spectral cooling. In each of the figures, the series coupled arrayed photocell junctions are represented by block 80. Additionally, for simplicity of illustration, a singular concentrator parabolic mirror is symbolically represented at 82. In FIG. 7A, one or more dichroic filters as represented at 84 may be employed, the component of 84 being shown in conjunction with filtered ray traces 86 and 88.

Figure 7B:
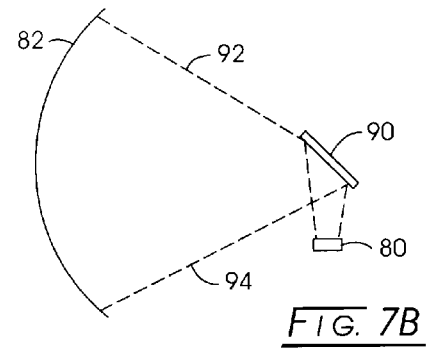

Looking to FIG. 7B, ISEC solar energy components are seen being removed by an angularly oriented dichroic reflector 90. Reflector 90 is shown in conjunction with ray traces 92 and 94.

Figure 7C:
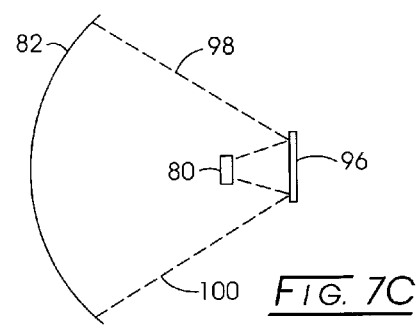
Figure 7D:
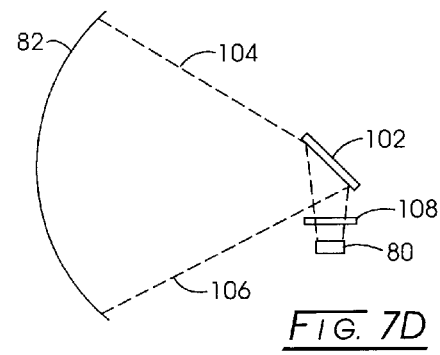

Looking to FIG. 7C, a directly confronting dichroic reflector is represented symbolically at 96 in conjunction with ray traces 98 and 100. Referring to FIG. 7D, an angularly oriented dichroic reflector is represented symbolically at 102 in conjunction with ray traces 104 and 106. However, positioned intermediate reflector 102 and photovoltic array 80 is a dichroic filter 108. Harkening back to FIG. 6, one of the dichroic devices may be employed to exclude the region represented at 64, while the other can be employed to exclude the regions represented at 74 and 76.

Figure 7E:
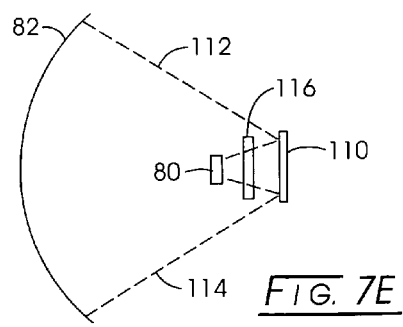

Referring to FIG. 7E, a directly confronting dichroic reflector is represented symbolically at 110 in conjunction with ray traces 112 and 114. As in the case of FIG. 7D, dichroic reflector 110 is combined with a dichroic filter represented symbolically at 116 to isolate the desired useful band of wavelengths.

Figure 7F:
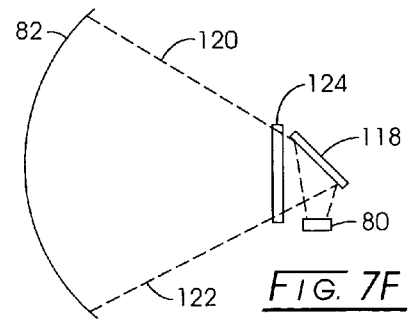

Looking to FIG. 7F, an angularly oriented dichroic reflector is represented symbolically at 118 in conjunction with ray traces 120 and 122. The useful band of wavelengths is further defined by a dichroic filter represented symbolically at 124 which directly confronts the concentration ray traces 120 and 122.

Figure 8:
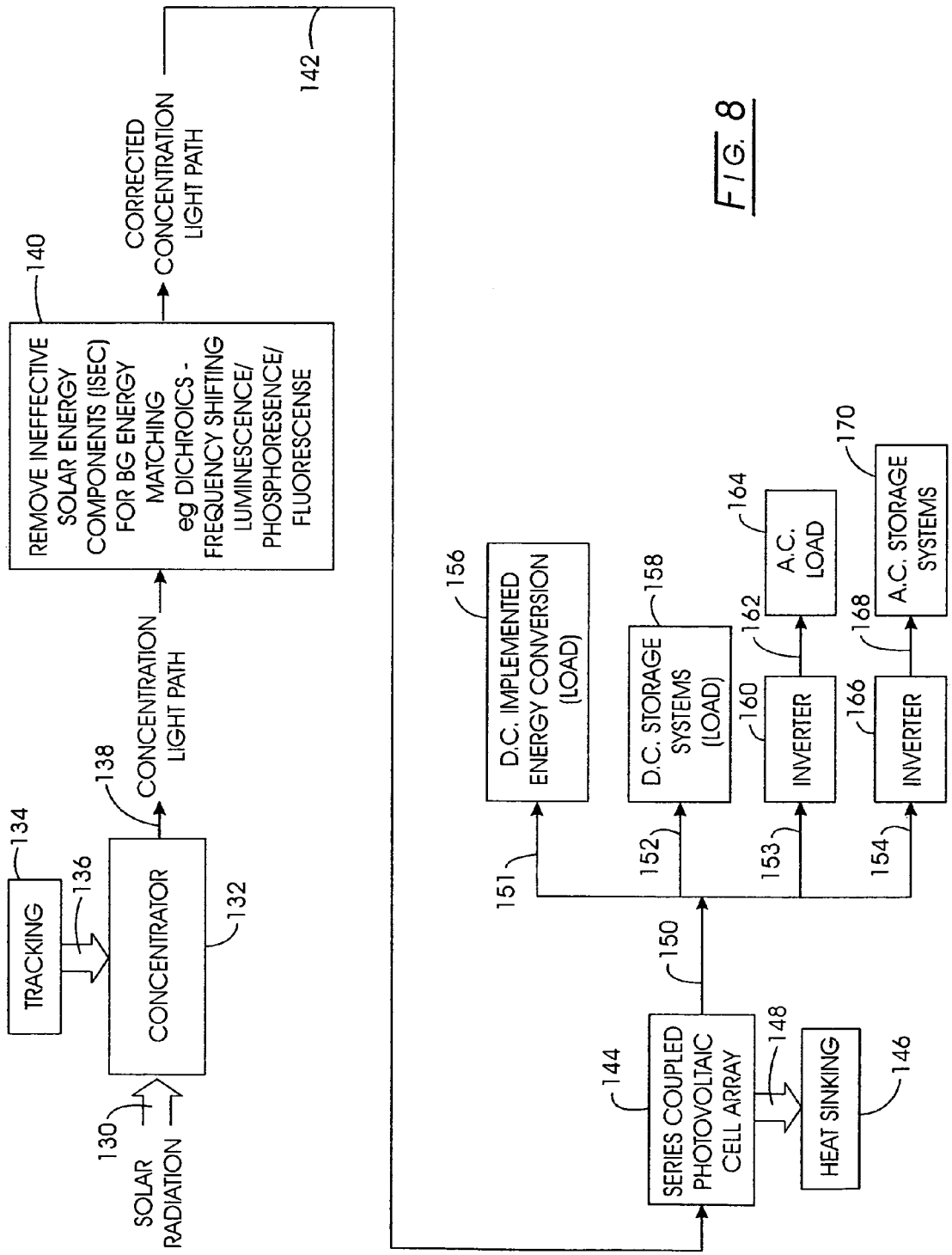
FIG. 8 is a schematic process flow diagram concerned with the removal of ineffective solar energy components (ISEC) for bandgap energy matching.

Referring to FIG. 8, the method and system of the invention utilizing the noted spectral cooling or removal of ISEC components is represented in process flow diagrammatic fashion. Impinging solar radiation is represented at arrow 130 extending to a primary concentrator represented at block 132. Concentrator 132 may take a variety of configurations and is shown in the instant figure in conjunction with a tracking function represented at block 134 and arrow 136. Tracking schemes also may take a variety of configurations, the more conventional providing for the rotation and pivoting of a parabolic form of primary concentrator. Upon concentrating the solar radiation, a concentration light path is derived as represented at arrow 138. That concentration light path then is treated by removing components of solar energy corresponding with at least a portion of those wavelengths substantially ineffective to evoke cell electrical output. The ISEC removal is represented at block 140. Notice that in addition to dichroics, removal of the unwanted wavelengths can also be carried out by frequency shifting utilizing the above-noted luminescence, phosphorescence or fluorescence. The result of this treatment is a corrected concentration light path represented at arrow 142 which is shown directed to a series couple photovoltaic cell array represented at block 144. Cell array 144 will be associated with a passive or active heat sinking function represented at block 146 and arrow 148. The resultant d.c. electrical output is represented at arrow 150 which, in turn, is associated with arrows 151–154. Arrow 151 extends to block 156 which carries out the option of d.c. implemented energy conversion as a load. This is a direct conversion, for example, it may be employed in conjunction with chemical processes.

Arrow 152 leading to block 158 shows an alternative wherein the d.c. input may be submitted to any of a variety of storage systems. Such storage systems can range from rechargeable batteries to water pumping schemes.

Arrow 153 is shown introducing d.c. current to an inverter as represented at block 160. The inverted output, then as represented at arrow 162 and block 164 may be directed to an a.c. load.

Arrow 154 also is seen introducing d.c. current to an inverter function as represented at block 166. The resultant a.c. output shown at arrow 168 being directed to an a.c. storage system represented at block 170.

Focusing an image of the sun through a dichroic system or the like directly into the receiving surface of the photovoltaic array is problematic. In this regard, as the primary concentrator tracks, difficulties arise as a sun image is formed for photocell operation. Of particular importance, direct imaging at the receiving surface will result in an uneven intensity distribution wherein electrons produced in conjunction with the bright spot will migrate to darker regions and not be available as an electrical output. It is therefore desirable to provide a Lambertian distribution across the entire photovoltaic cell receiving surface.

Figure 9:
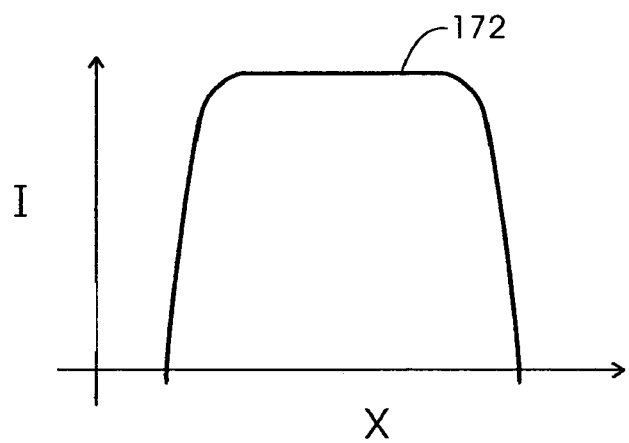
FIG. 9 is a curve schematically showing a Lambertion distribution.

Looking to FIG. 9, such a distribution of uniform intensity level is represented at Lambertian curve 172 plotting intensity against distance across the receiving surface. A variety of techniques are available for achieving this distribution.

Figure 10:
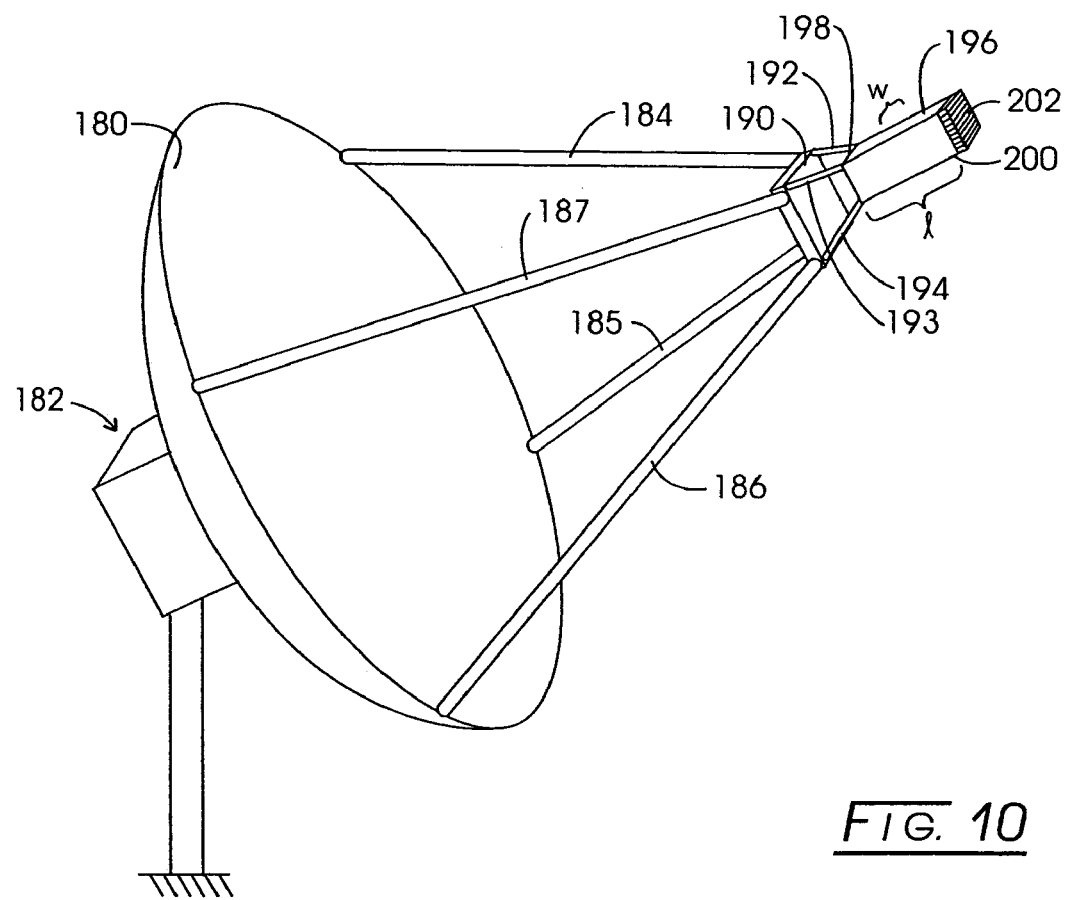
FIG. 10 is a schematic pictorial representation showing the utilization of a light homogenizing solid prism in accordance with the invention.

Looking to FIG. 10, one approach to homogenizing the focused light or effecting the generation of uniform light intensity across the receiving surface of the photocell array is depicted. In the figure, a primary concentrator is symbolically represented as a parabolic mirror 180. Mirror 180 is supported upon a post and tracking arrangement represented generally at 182. Extending outwardly and converging inwardly from the periphery of mirror 180 are four struts 184–187 which, in turn, support a bracket 190 at its four corners. Bracket 190 may incorporate, for example, a dichroic filter. Supported outwardly from the bracket 190 by four smaller struts, three of which are seen at 192–194, is a non-imagining homogenizer concentrator 196 having an entrance 198 at which sun rays are focused and extending to an exit or output surface 200 which is in operative association with the receiving surface of a multijunction series coupled photocell array 202. Homogenizer 196 may be provided in one embodiment as an elongate prism effecting internal reflections of light which function to homogenize it. Preferably, the ratio of the length, l, to the width, w, of the prism 196 should be about three or four to one. While prism 196 is shown having a square cross sectional configuration, it may assume a variety of shapes, for example, it may be circular.

Figure 11:
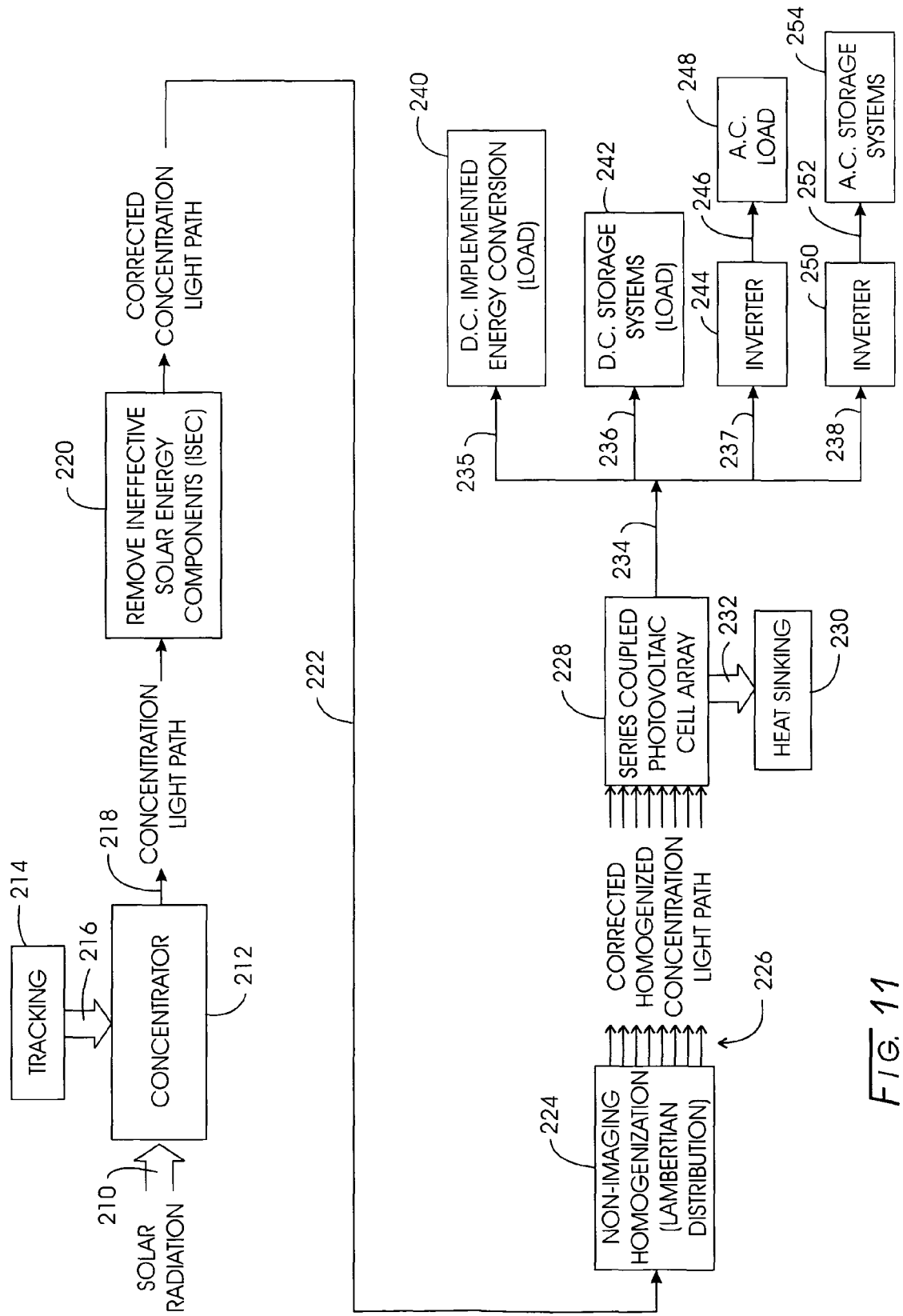
FIG. 11 is a schematic process flow diagram showing the removal of ISEC components from a concentration light path to provide a corrected concentration light path and a non-imagining homogenization of the latter path.

Referring to FIG. 11, the system and method now are illustrated in conjunction with the non-imagining homogenization of the corrected concentration light path. In the figure, incoming solar radiation is represented at arrow 210 extending to a concentrator 212 such as a parabolic mirror or the like. Concentrator 212 conventionally will be associated with a tracking function as represented at block 214 and arrow 216. The result of this concentration is a concentration light path as represented at arrow 218. This concentration light path then is treated as represented at block 220 by removing ineffective solar energy components (ISEC). Thus treated, a corrected concentration light path is evolved as represented at arrow 222. Corrected concentration light path 222 then is subjected to non-imaging homogenization as represented at block 224 which, in effect, derives a Lambertian distribution. A corrected homogenized concentration light path then is evolved as represented at the arrow array shown generally at 226. That corrected homogenized concentration light path is then directed to the receiving surface of a series coupled photovoltaic cell array represented at block 228. In addition to spectral cooling, as represented at block 230 and arrow 232 heat sinking additionally may be employed in conjunction with the cell array 228. A d.c. output then is directed from the cell array as represented at arrows 234–238. Arrow 235 is seen directed, as an option to a d.c. implemented energy conversion load 240 as described earlier. Arrow 236 is directed to block 242 providing for the optional distribution to d.c. storage systems as a load. The d.c. input at arrow 237 is directed to an inverter function as represented at block 244 which, as represented at arrow 246 and block 248 provides an a.c. output for driving an a.c. load. The d.c. input at arrow 238 also is directed to an inverter as represented at block 250, the a.c. output of which, as represented at arrow 252 and block 254 concerns the option of a.c. storage systems.

Figure 12:
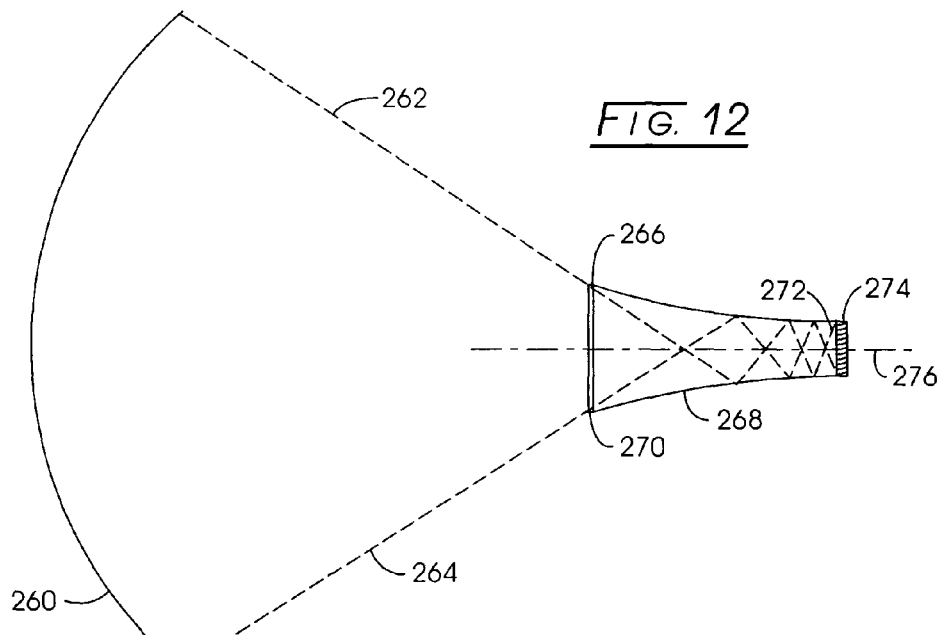
FIG. 12 is a schematic diagram showing the utilization of a parabolic primary concentrator, a dichroic component and a non-imagining secondary concentrator.

Concentration path image drift can be accommodated for as well as homogenization and removal of ineffective solar energy components (ISEC) through the utilization of a non-imagining secondary concentrator. Referring to FIG. 12 such a primary-secondary concentrator configuration is schematically portrayed. The primary concentrator is represented as a parabolic mirror 260 having a concentration light path represented by ray traces 262 and 264 which are illustrated as extending through a dichroic filter 266 positioned at the entrance to a generally horn-shaped non-imagining secondary concentrator 268. In general, the focal plane of primary concentrator 260 is at the entrance 270 of secondary concentrator 268. The secondary concentrator 268 is hollow and the interior surfaces of it are reflective. With the slanted configuration of these surfaces, homogenization of the concentration light path is achieved as the light reaches the smaller exit 272. Adjacent exit 272 is a series coupled photocell array 274. The sides of secondary concentrator 268 may be formed to define a logarithmic curve. However, it has been found that merely sloping these sides at a shallow angle will achieve appropriate homogenization. In general, it has been determined that five internal reflections are required to evoke a homogenization of entering light without light being rejected or reflected outwardly from the secondary concentrator. Where a logarithmic curvature is employed with the devices, the entering angle with respect to the central axis 276 of the device is 30° and that curvature then progresses to approximately 0° at the exit. Where linear sloping sides for the concentrators are employed, then the slope of the sides with respect to the central axis will generally fall between about 7° and about 12°.

Figure 13:
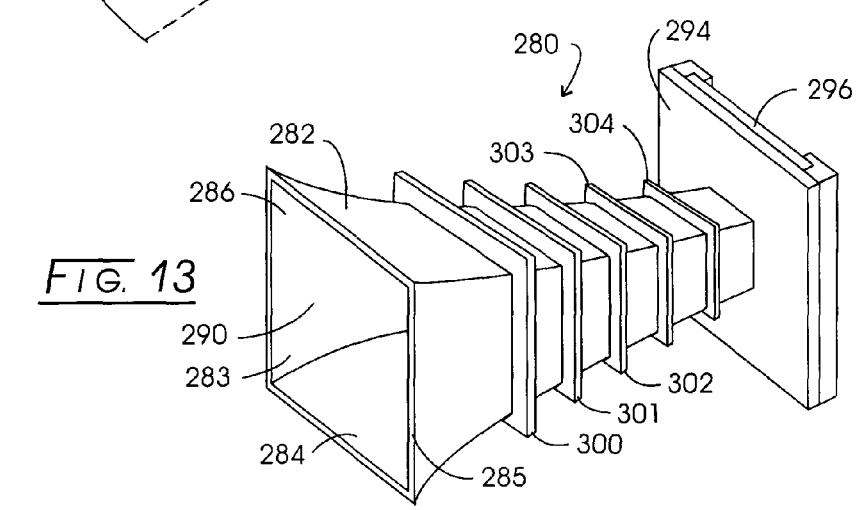
FIG. 13 is a perspective view of a secondary concentrator and photovoltaic array support in accordance to the invention.
Figure 13A:
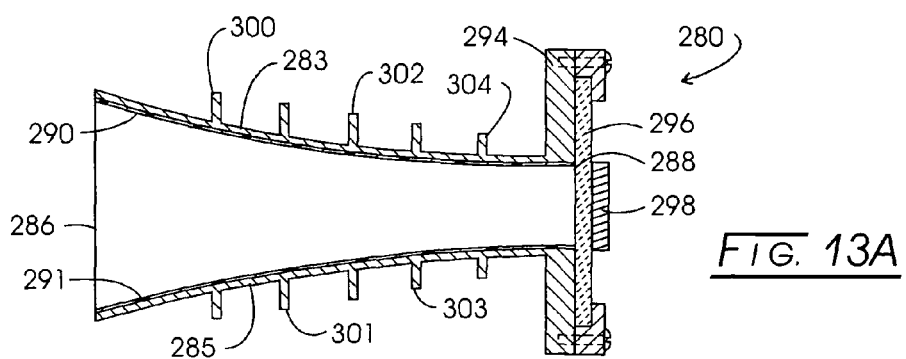
FIG. 13A is a sectional view of the components of FIG. 13.

Removal of ineffective solar energy components can be accomplished utilizing the internal surfaces of the secondary concentrator. Referring to FIGS. 13 and 13A, such an arrangement is depicted. In the figures, the secondary concentrator is represented generally at 280. Concentrator 280 is configured with four sloping sides 282–285 which extend from a rectangular entrance 286 to a smaller rectangular exit seen in FIG. 13A at 288. That figure further reveals that the interior surfaces of sides 282–285 are covered with dichroic mirror material two components of which are seen at 290 and 291. Secondary concentrator 280 is seen supported by a rearwardly disposed bracket 294 which, in turn, supports a transparent rectangular piece of glass 296 to which the series coupled photocell array seen in FIG. 13A is coupled in alignment with exit 288. By utilizing the dichroic mirror material on the interior of concentrator 280, ineffective solar energy components are transmitted through mirror surfaces and, thus, the horn-like structure will absorb heat energy. To accommodate for this heat energy the device, for example, may be provided with a passive heat sinking arrangement such as the fins represented at 300–304. Devices as at 280 may be formed, for example, of aluminum or plastic.

Figure 14:
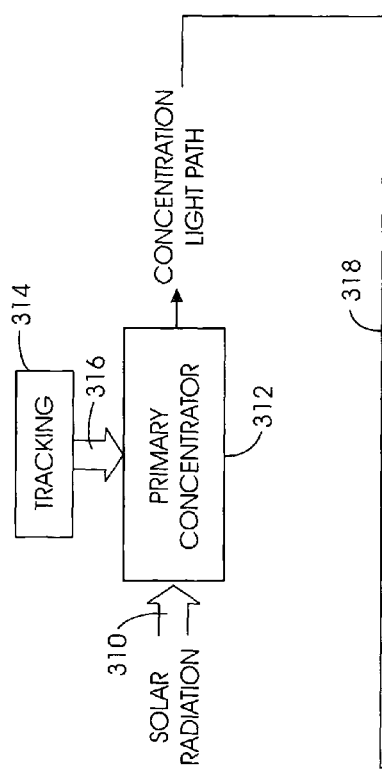
FIG. 14 is a schematic process flow diagram showing a primary concentrator, concentration light path, secondary concentrator with the removal of ISEC components and homogenization to evolve a corrected homogenized concentration light path.
Figure 14:
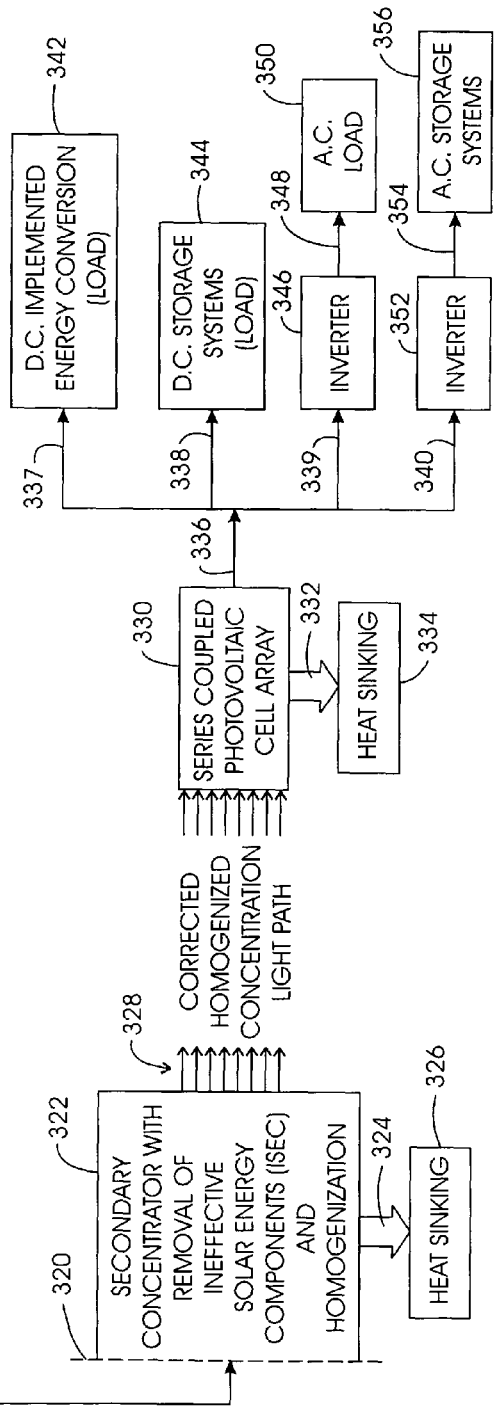

Referring to FIG. 14, a process flow diagram is presented incorporating the primary and secondary concentrator approach. Solar radiation is represented at arrow 310 being directed to a primary concentrator as represented at block 312. In conventional fashion, the primary concentrator is configured with suntracking features as represented at block 314 and arrow 316. A concentration light path then is developed as represented at arrow 318 which images at a focal plane represented at dashed line 320 at the entrance of a secondary concentrator represented at block 322. Secondary concentrator 322 removes ineffective solar energy components (ISEC) and carries out an internal reflection developed homogenization of the light. Removal of ISEC wavelengths transfers kinetic energy to the secondary concentrator and thus, it may be employed in conjunction with heat sinking as represented at arrow 324 and block 326. The resultant corrected homogenized concentration light path then is represented at the arrow array shown generally at 328. This corrected homogenized concentration light path then is directed to the receiving surface of a series coupled photovoltaic cell array as represented at block 330. The substantially lessened heat build up at photovoltaic cell array 330 is accommodated by heat sinking as represented at arrow 332 and block 334. A resultant d.c. output then is utilized in any of various ways as represented at output arrows 336–340. In this regard, output arrow 337 is directed to block 342 representing d.c. implemented energy conversion as a load. Arrow 338 is seen to be directed to block 344 representing d.c. storage systems as a load. Arrow 339 is seen directed to block 346 representing an inverter function to provide a corresponding a.c. output to an a.c. load as represented at arrow 348 and block 350. Lastly, arrow 340 is seen to be directed to an inverter function represented at block 352 and the a.c. output is seen to be directed to a.c. storage systems as represented at arrow 354 and block 356.

Figure 15:
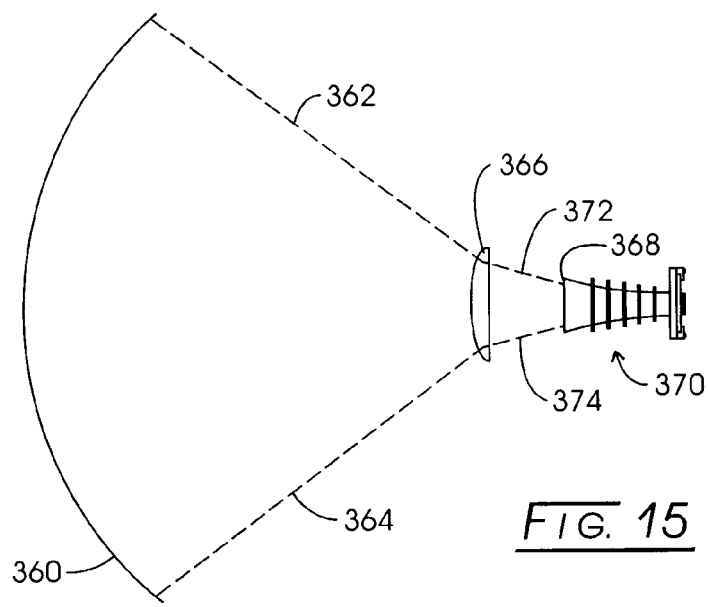
FIG. 15 is a schematic representation of a spherical primary concentrator combined with a coma corrector and a secondary concentrator.

Now looking to the designs of primary concentrators, initially it may be observed that spherical mirrors are more easily produced than, for example, parabolic mirrors. However, the spherical mirror will create a coma form of distortion at the image plane. Looking to FIG. 15, a spherical mirror is symbolically represented at 360 in conjunction with ray traces 362 and 364. A coma corrector lens is symbolically represented at 366 at the image plane of the mirror 360 which, in turn, functions to focus the concentration light path at the entrance 368 of a secondary concentrator represented in general at 370. For convenience, secondary concentrator 370 is seen to be structured in the same manner as concentrator 280 described in connection with FIGS. 13 and 13A. The focusing ray traces from the coma corrector lens 366 are represented at 372 and 374.

Figure 16A:
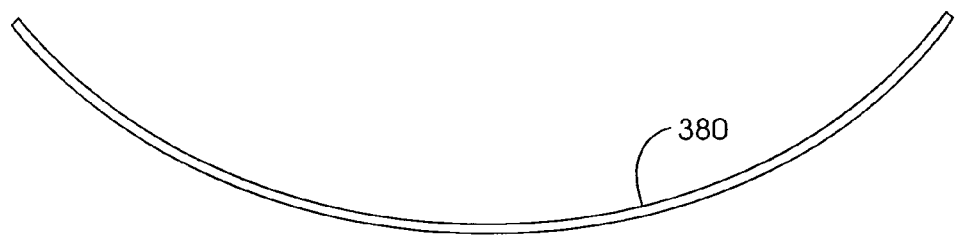
FIG. 16A is a representation of a parabolic mirror.
Figure 16B:
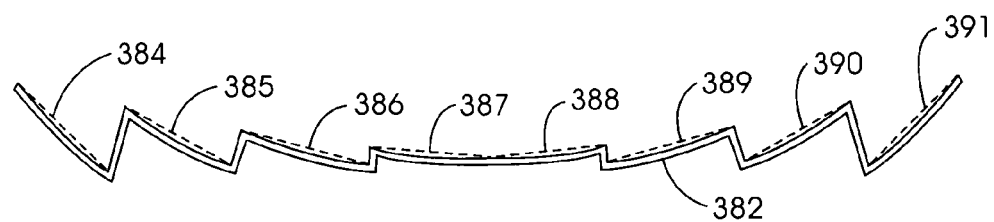
FIG. 16B is a schematic representation of a conversion of the parabolic mirror of FIG. 16A to a Fresnel structure and further showing a modification wherein the latter structure has flat surfaces.

Parabolic forms of primary concentrators may assume a variety of configurations, one being in Fresnel or etalon structuring. Looking to FIGS. 16A and 16B, a parabolic mirror 380 is seen to be restructured in etalon format at 382 in FIG. 16B. This structure may be further modified such that instead of each etalon having a parabolic curvature, it is flat as represented by the dashed line components 384–391. These components have a widthwise extent corresponding with the widthwise extent of the photocell array receiving surfaces which they may be focused. Additionally, because of the flatness of the surface, the resultant concentration light path will be homogenized.

The spectral cooling features of the invention may be applied to multi-spectral systems wherein multi-junction cell arrays are provided at discrete locations and are formulated utilizing a combination of Periodic III–V semiconductor materials to capture an expanded range of photon energies and enhance the overall efficiency of the solar conversion systems. Referring to FIG. 17 a Planck curve again is represented schematically at 400. For exemplary purposes, curve 400 is associated with vertical dashed lines each representing bandgap energy for one of the multi-spectral configurations of photo cells. In this regard, note that a germanium, (Ge) bandgap energy line is represented at 402. Low energy and heat creating photon interaction are represented at wavelengths above that at line 402 as represented by hatched area 404. On the other hand, a useful band of wavelengths may be represented at area 406 which extends to vertical dashed line 408 corresponding with an exemplary silicon based multijunction photocell array. Only that region of the curve represented at hatched portion 410 will be unused as heat generating photon energy. Note that the bandgap energy line 408 for silicon resides at the terminus of the germanium wavelength band of useful energy. The silicon wavelength band of useful energy is present at region 412 having a lower terminus at bandgap energy dashed line 414. Line 414 corresponds with the bandgap energy wavelength of a gallium arsenide (GaAs) structured photovoltaic cell. Energy which will be converted to heat with respect to the silicon photovoltaic structure performance is represented at the hatched region 416. The gallium arsenide wavelength band of useful energy is represented at region 418 extending to vertical dashed line 420 representing the bandgap energy of an indium phosphide (InP) structured photovoltaic cell array. That energy which converts to heat within that useful bandwidth 418 is represented at hatched area 422. In similar exemplary fashion, the wavelength band of useful photon energy for a photocell array structured of indium phosphide is represented at region 424, while the corresponding region within that wavelength band generating heat is represented at hatched area 426. As is apparent, the dichroic system which derives spectral cooling for the multi-spectral photovoltaic cell components is one rejecting light wavelengths of upwardly increasing values while accepting values lower than the wavelength representing bandgap energy.

Figure 17:
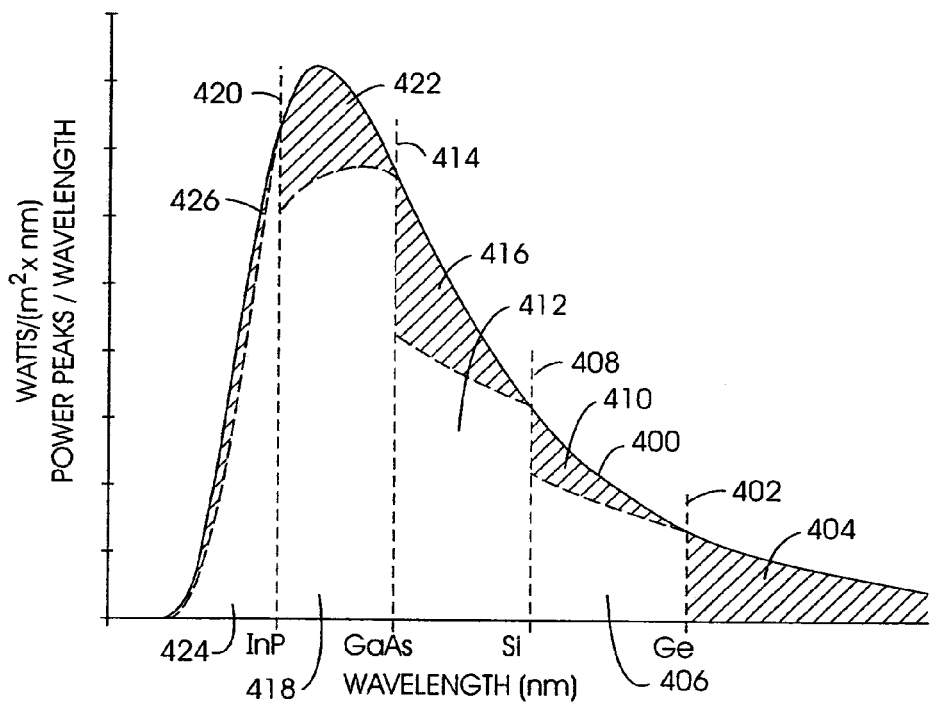
FIG. 17 is a Planck curve describing the utilization of select bandgap energies with discrete photovoltaic components.
Figure 18:
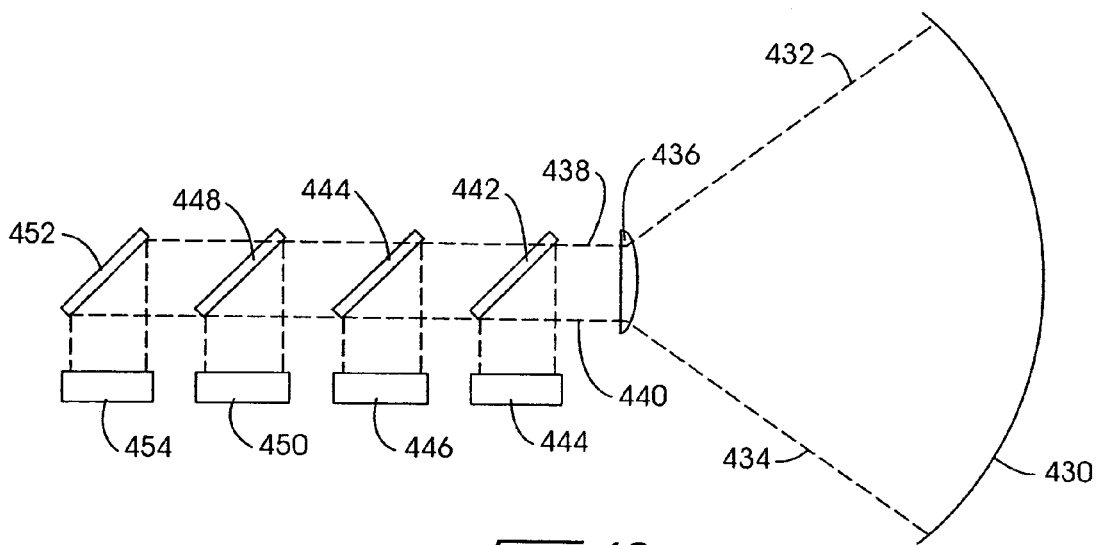
FIG. 18 is a schematic representation of a dichroic component development of bandgap energy matched series coupled photovoltaic cell arrays.

Referring to FIG. 18, a dichroic separation system corresponding with the exemplary arrangement of FIG. 17 is presented. In the figure, a spherical primary concentrator mirror is represented at 430 in conjunction with ray traces 432 and 434. As described in connection with FIG. 15, traces 432 and 434 image a coma and, thus, a coma corrector lens 436 is provided at the image plane of mirror 430. Ray traces from corrector lens 436 are represented at 438 and 440. These traces first encounter dichroic mirror or reflector represented symbolically at 442 which, assuming the arrangement of FIG. 17 diverts photon energy which is bandgap matched, for example, to a germanium structured photovoltaic cell array represented symbolically at 444. Similarly, a dichroic device which is bandgap matched to a silicon based photovoltaic cell array is next presented in sequence, the latter array being symbolically represented at block 446. Next, a dichroic device 448 which, for example, is bandgap matched to a gallium arsenide structured photovoltaic photocell array is represented in conjunction with the latter array as represented symbolically at block 450. Finally, a dichroic device represented symbolically at 452 may divert a useful wavelength band to a bandgap matched photovoltaic cell array structured, for example, of indium phosphide as represented symbolically at block 454.

Figure 19:
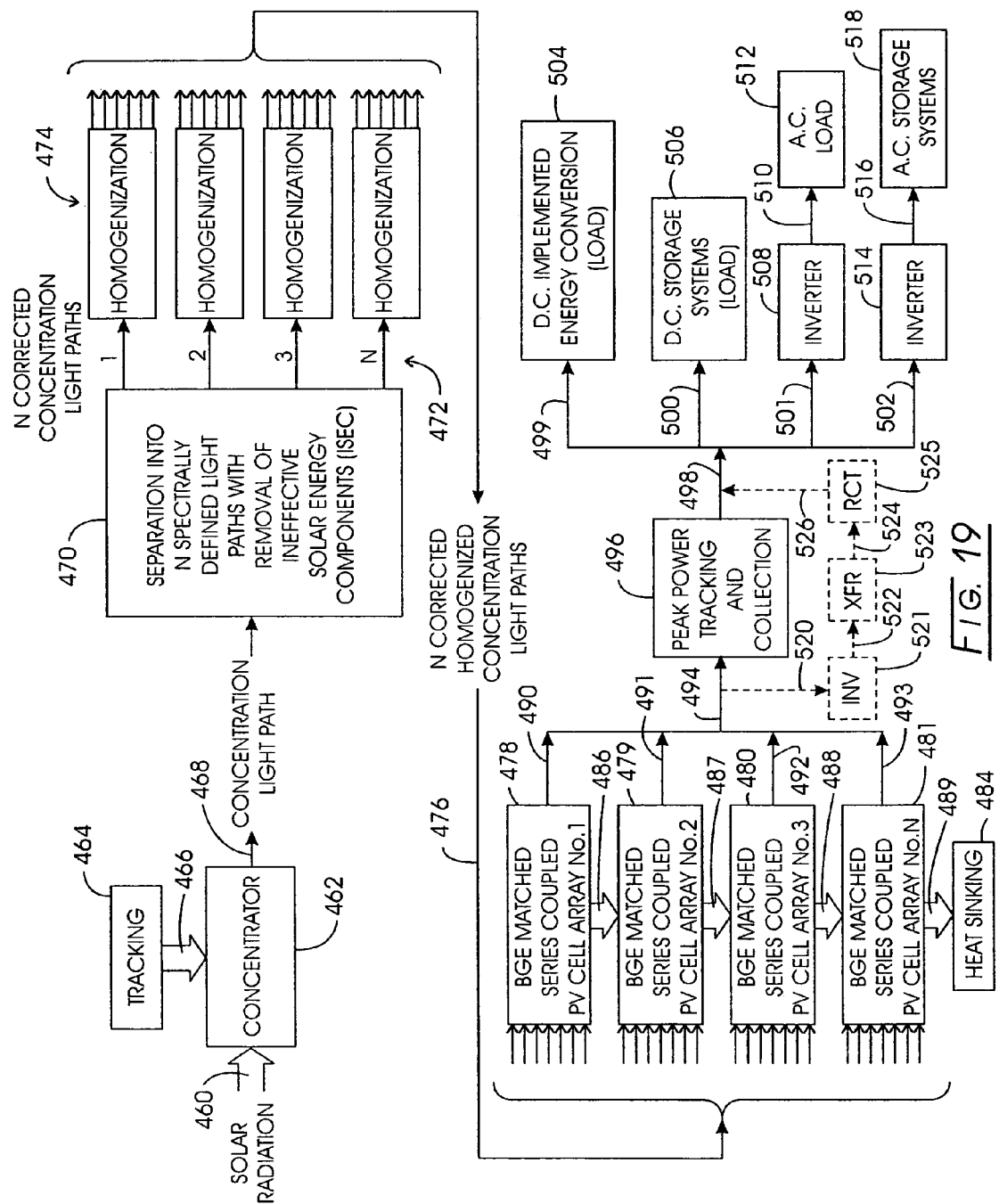
FIG. 19 is a schematic process flow diagram showing the development of a concentration light path, separation thereof into spectrally defined light paths with removal of ISEC components, homogenization, bandgap energy matched series coupled photovoltaic cell arrays and peak power tracking and collection.

Referring to FIG. 19 a flow diagram of one approach to the multi-spectral systems symbolically discussed in connection with FIG. 18 is presented. In the figure, solar radiation is represented at arrow 460 in conjunction with a light concentrator represented at block 462. Concentrator 462 may be associated with suntracking features as represented at block 464 and arrow 466. A concentration light path is represented at arrow 468 extending to block 470. Block 470 represents a function providing for the separation of the concentration light path into 1 through N spectrally defined light paths with removal of ineffective solar energy components (ISEC). In consequence, N corrected concentration light paths are created as represented by the arrow array identified generally at 472. Each of the N corrected concentration light paths then is directed to a light homogenization function as represented at homogenization block array shown generally at 474 to provide N corrected homogenized concentration light paths as generally identified at arrow 476. Each of the N corrected homogenized concentration light paths is directed to a bandgap energy matched series coupled photovoltaic cell array. These cell arrays as numbered one through N, are represented at respective blocks 478–481. As before, the photocell arrays are associated with a heat sinking function as represented at block 484 and respective arrows 486–489. The d.c. outputs of the photovoltaic cell arrays are collected or combined as represented by arrows 490–494. Because the d.c. levels will typically be different, their collection must be accommodated for. For example, this collection may be carried out with a peak power detecting and collecting circuit. Optionally, the outputs can be inverted and directed to discrete inputs to the core of the primary side of a transformer and then rectified. This collection and peak power tracking is represented at block 496. The d.c. output from the function of block 496 is represented at arrows 498–502. The noted optional, transformer based collection approach is illustrated in phantom in the figure. In this regard the outputs at arrow 494 are directed, as represented at arrow 520 and block 521 to an inverter function. The outputs from the inverter function 521 at arrow 522 are directed to discrete components of the primary side of a transformer represented at block 523. A collected a.c. output then is produced at arrow 524 and then rectified as represented at block 525. The rectified output then is conveyed to arrow 498 as shown at arrow 526. As before, as represented at arrow 499, one potential use of the d.c. output is into a d.c. implemented energy conversion load represented at block 504. Another utilization may be an introduction to d.c. storage systems. As represented at arrow 500 and block 506, the d.c. output may be inverted as represented at arrow 501 and block 508, whereupon as represented at arrow 510 the a. c. output may be directed to an a.c. load as represented at block 512. As another approach, as represented at arrow 502 and block 514, the d.c. output may be inverted to provide an a.c. input a.c. storage systems as represented at arrow 516 and block 518.

The spectral separation described in connection with block 470 may be implemented in the primary concentrator itself. Referring to FIGS. 20 and 20A a Fresnel implemented primary concentrator is schematically represented in general at 530. The exploded view of FIG. 20A reveals that the concentrator 530 is formed of a sequence of four transparent Fresnel mirror structures represented generally at 531–534. Structure 531 is configured with a transparent Fresnel pattern 531*a*, a flexible dichroic membrane 531*b* and a complimentary transparent Fresnel mirror pattern 531*c*. Structure 531*c* may be considered the negative or reverse version of pattern 531*a* and functions to support the flexible dichroic membrane 531*b* such that is assumes and provides a dichroic mirror function with respect to the inwardly disposed etalon components of lens 531*a*.

Fresnel structure 532 is similarly configured with Fresnel components 532*a* and 532*c* which conform flexible dichroic reflecting membrane 532*b* into Fresnel structure 532*a*. Fresnel structure 533 is similarly comprised of forward Fresnel structure 533*a*, dichroic reflective membrane 533*b* and complimentary Fresnel structure 533*c*. Finally, Fresnel structure 534 is formed of transparent Fresnel structure 534*a*, dichroic membrane 534*b* and complimentary Fresnel structure 534*c*. Fresnel components 531–534 are adjusted or slightly offset such that their focal points are displaced for operative of association with the entrances of secondary concentrators extending to bandgap energy matched series coupled photovoltaic cell arrays. In this regard, FIG. 20 reveals ray traces 536 and 538 extending from Fresnel structure 531 to secondary concentrator and band matched photovoltaic array 540. Ray traces 542 and 544 are seen to extend from Fresnel structure 532 to a focal point at the entrance of secondary concentrator and associated bandgap energy matched photovoltaic cell array as represented generally at 546. Ray traces 548 and 550 are seen to extend from Fresnel structure 533 to a focal point at the entrance of secondary concentrator and associated bandgap energy matched photovoltaic cell array as represented generally at 552. Ray traces 554 and 556 extend from Fresnel structure 534 to a focal point at the entrance of secondary concentrator and associated bandgap energy matched photovoltaic cell array as represented generally at 558.

The removal of ineffective solar energy components (ISEC) as well as separation of the concentration light path into bandgap energy matched series coupled photovoltaic cell arrays also can be carried out with transparent parabolic primary concentrator structures which are treated with a dichroic component and which are slightly offset. Such an arrangement of color selective mirrors is schematically illustrated in FIG. 21. In the figure, parabolic structure 570 is seen to be associated with ray traces 572 and 574 which extend to a focal point at the entrance of secondary concentrator and associated bandgap energy matched series couple photovoltaic cell array as represented generally at 576. Parabolic dichroic reflector and primary concentrator 578 also removes ISEC components and is offset from dichroic primary concentrator 570. In this regard, ray traces 580 and 582 extend from the dichroic treated primary concentrator 578 to a focal point at the entrance of secondary concentrator and associated bandgap energy matched series coupled photovoltaic cell array as represented generally at 584. Lastly, a parabolic primary concentrator 586 is seen to be displaced from both primary concentrators 578 and 570. The concentrator 586 additionally is configured with dichroics to effect removal of ISEC. The offset primary concentrator is seen having ray traces 588 and 590 extending therefrom to a focal point at the entrance of secondary concentrator and associated bandgap energy matched series couple photovoltaic cell array as represented generally at 592. It may be noted that the secondary concentrators as described in connection with FIGS. 20 and 21 also may be configured both as homogenizers and for additional ISEC removal. Such removal is indicated in the figures by the presence of heat sinking fins.

Figure 22:
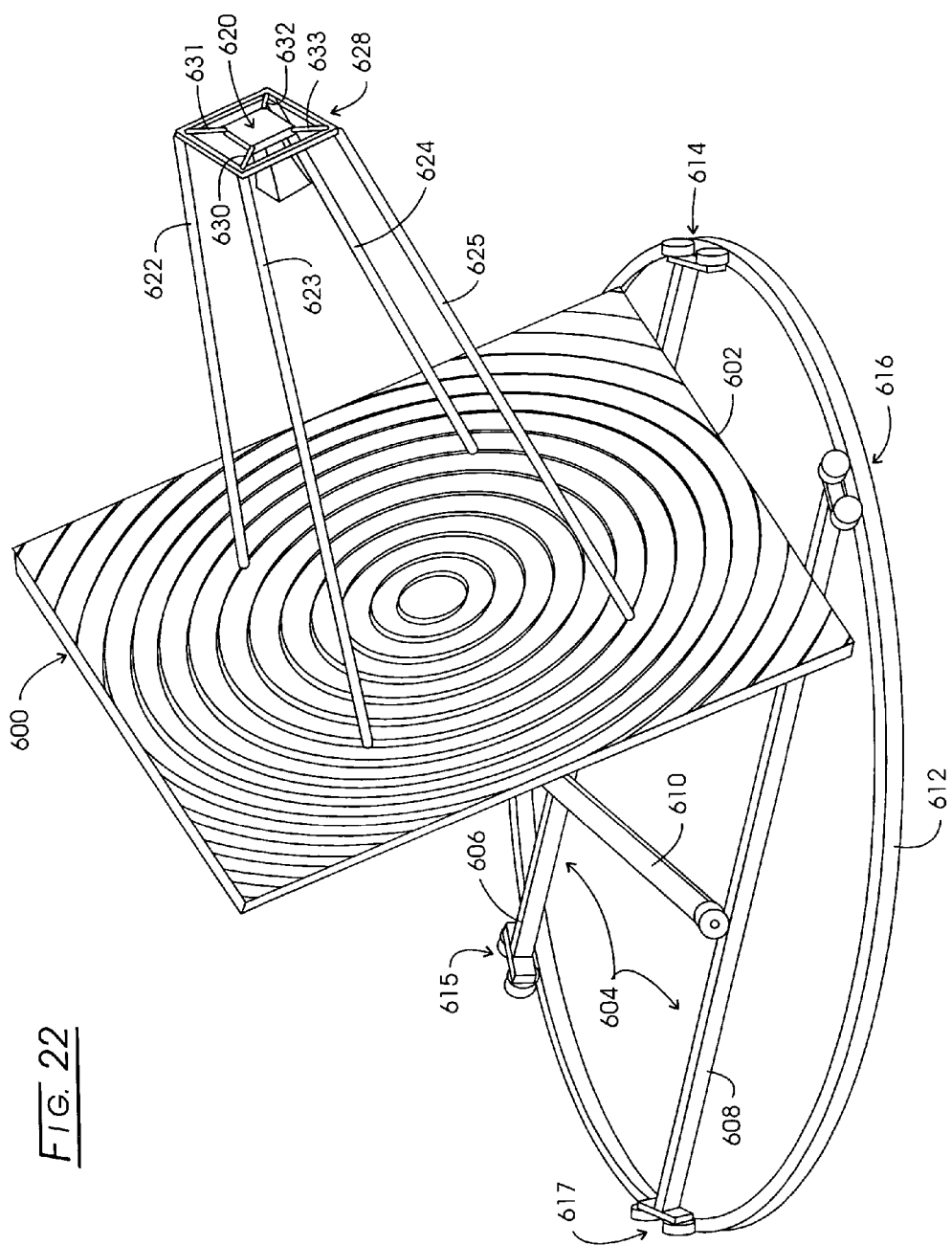
FIG. 22 is a schematic pictorial representation of a system according to the invention associated with suntracking features.

The mounting of the primary concentrators for tracking purposes may be relatively large, for example, a Fresnel structure which is about fifty feet square. Accordingly, wind loads on these devices from time to time may be quite severe. Thus, it is of benefit to be able to readily maneuver them into a horizontal position to avoid wind damage. One such arrangement is schematically portrayed in FIG. 22. Looking to that figure, a large rectangular Fresnel structured primary concentrator is shown generally at 600. Concentrator 600 is partially supported at its lower edge 602 which in turn, is pivotally mounted upon a carriage represented generally at 604 and herein depicted as being formed with an assembly including two rack-defining beams 606 and 608 which cooperate with associated pinion and strut components, one of which is schematically revealed at 610. As is apparent, the azimuthal attitude of the primary concentrator 600 may be adjusted for tracking purposes and for lowering the device to a horizontal orientation by manipulation of the strut and pinion components as at 610. Carriage 604 is mounted for rotation upon a horizontal circular rail or support 612 which typically will be located at about ground level. Rotational movement of the carriage on the circular support 612 is represented by tandem wheel carriages as represented generally at 614 and 615 with respect to rack beam 606 and at 616 and 617 with respect to rack beam 608. A secondary concentrator and associated photovoltaic cell array is shown in general at 620 located in spaced relationship from primary concentrator 600. This spacing is provided by four angularly orientated struts 622–625 which extend to corresponding corners of a rectangular spider mount represented generally at 628 having four angularly disposed secondary concentrator supports 630–633.

Since certain changes may be made in the above method and system without departing from the scope of the invention herein involved, it is intended that all matter contained in the above-description or shown in the accompanying drawings shall be interpreted as illustrative and not in a limiting sense.

The invention claimed is:

1. The method for deriving an electrical output from solar radiation, comprising the steps of:
   (a) providing a serially coupled multijunction photovoltaic cell having, a series connected array of junction unit cells with a stack orientation, a multijunction defined edge illumination receiving surface, said stack orientation being at a stack angle with respect to said receiving surface equivalent to Brewster's angle, an electrical output derivable at terminals and formed of impurity doped photovoltaic material exhibiting a given bandgap energy at a bandgap energy wavelength and a wavelength defined band of useful energy extending below said bandgap energy wavelength;
   (b) providing an imaging primary concentrator;
   (c) concentrating said solar radiation within a concentration light path with said imaging concentrator;
   (d) removing components of solar energy at said concentration light path, prior to the light impinging on said receiving surface, corresponding with at least a portion of those wavelengths above said bandgap energy wavelength;
   (e) providing a non-imaging internally reflecting secondary concentrator having a centrally disposed axis, an entrance of given dimensional extent located to receive said concentration light path, having an exit adjacent said receiving surface of dimensional extent less than said given dimensional extent and having an internally reflecting surface effective to homogenize light within said concentration light path while directing light in an impinging direction toward said cell edge illumination receiving surface effective to permit generation of said electrical output; and
   (f) coupling said terminals with a load.

2. The method of claim 1 in which said step (d) removes components of solar energy from said concentration light path by effecting a frequency shift thereof.

3. The method of claim 2 in which said frequency shift is carried out with luminescence, phosphorescence or fluorescence.

4. The method of claim 1 in which said step (d) is carried out with a dichroic device removing solar energy corresponding with wavelengths greater than said bandgap energy wavelength.

5. The method of claim 1 in which said step (a) wavelength defined band of useful energy extends from said bandgap energy wavelength to about one-half said bandgap energy wavelength.

6. The method of claim 1 in which said step (d) is carried out with a dichroic device removing solar energy corresponding with wavelengths below said wavelength defined band of useful energy.

7. The method of claim 1 in which:
   said step (b) is carried out with a mirror implemented primary concentrator reflecting solar radiation to define said concentration light path.

8. The method of claim 1 in which:
said step (e) is at least partially carried out by providing said internally reflecting surface as a dichroic device.

9. The method of claim 1 in which said step (e) secondary concentrator has a sloping internal reflecting surface which is provided as an inwardly depending logarithmically defined surface.

10. The method of claim 1 in which said step (e) secondary concentrator has a sloping internal surface which is provided as an inwardly sloping surface having a slope angle of about 7° to about 12° with respect to said centrally disposed axis.

11. The method of claim 1 in which:
said step (b) is carried out with a spherical mirror implemented primary concentrator imaging solar radiation as a coma of light distribution, and a coma corrector lens imaging said coma of light distribution at an image focal point defining said concentration light path.

12. The method of claim 1 in which:
said step (b) is carried out with a Fresnel mirror implemented primary concentrator reflecting solar radiation to an image point defining said concentration light path.

13. The method of claim 1 in which:
said step (a) provides more than one said multijunction photovoltaic cell each said cell being formed of a unique photovoltaic material exhibiting a unique bandgap energy wavelength and a unique wavelength defined band of useful energy;
said step (d) removes components of solar energy corresponding with wavelengths greater than said unique bandgap energy wavelength with respect to each said cell to derive more than one unique concentration light path; and
said step (e) directs each said unique concentration light path to impinge upon the illumination receiving surface of a corresponding unique cell.

14. The method of claim 13 in which:
said step (a) provides one said multijunction photovoltaic cell as a stacked germanium junction cell exhibiting a germanium wavelength defined band of useful energy; and
provides another said multijunction photovoltaic cell as a stacked silicon junction cell exhibiting a silicon bandgap energy wavelength generally at a lower terminus of said germanium band of useful energy and having a wavelength defined silicon band of useful energy;
said step (d) is carried out with a first dichroic device removing solar energy corresponding with wavelengths greater than said germanium bandgap energy wavelength to derive a germanium concentration light path; and
with a second dichroic device removing solar energy corresponding with wavelengths substantially extending from said silicon bandgap energy wavelength to said germanium bandgap energy wavelength to derive a silicon concentration light path; and
said step (e) diverts said germanium concentration light path to the edge illumination receiving surface of said germanium junction cell; and
directs said silicon concentration light path to the edge illumination receiving surface of said silicon junction cell.

15. The method of claim 13 in which:
said step (a) provides one said multijunction photovoltaic cell as a stacked silicon junction cell exhibiting a silicon bandgap energy wavelength and wavelength defined silicon band of useful energy, and
provides another said multijunction photovoltaic cell as a stacked gallium arsenide cell exhibiting a gallium arsenide bandgap energy wavelength generally at the terminus of said silicon band of useful energy and having a wavelength defined gallium arsenide band of useful energy;
said step (d) is carried out with a first dichroic device, removing solar energy corresponding with wavelengths greater than said silicon bandgap energy wavelength to derive a silicon concentration light path, and
with a second dichroic device removing solar energy corresponding with wavelengths substantially extending from said gallium arsenide bandgap energy wavelength to said silicon bandgap energy wavelength to derive a gallium arsenide concentration light path; and
said step (e) directs said silicon concentration light path to the edge illumination receiving surface of said silicon junction cell, and
directs said gallium arsenide concentration light path to the edge illumination receiving surface of said gallium arsenide junction cell.

16. The method of claim 1 in which:
said steps (b) and (d) are carried out with a concentrator mirror assembly configured with dichroic components effective to remove said components of solar energy.

17. The method for deriving an electrical output from solar radiation, comprising the steps of:
(a) providing a series-connected multijunction photovoltaic cell having an illumination receiving surface, a derivable electrical output, exhibiting a given bandgap energy at a bandgap energy wavelength and a wavelength defined band of useful energy extending below said bandgap energy wavelength;
(b) providing an imaging primary concentrator;
(c) imaging said solar radiation with said primary concentrator to an image focal point within a concentration light path;
(d) providing a non-imaging internally reflecting secondary concentrator having a centrally disposed axis, an entrance of given dimensional extent located to receive said concentration light path at said focal point, having an exit adjacent said receiving surface of dimensional extent less than said given dimensional extent and having a sloping internally reflecting surface effective to homogenize light within said concentration light path while internally directing light in an impinging direction toward said receiving surface to derive said electrical output; and
(e) removing components of solar energy from said concentration light path, prior to the light impinging on said receiving surface, corresponding with at least a portion of those wavelengths above said bandgap energy wavelength.

18. The method of claim 17 in which said step (a) provides said multijunction photovoltaic cell as a back surface point contact cell device.

19. The method of claim 17 in which said step (a) provides:
said multijunction photovoltaic cell as a series connected stacked array of junction cells with a stack orientation, said receiving surface is a multijunction defined edge illumination receiving surface and said stack orientation is at a stack angle with respect to said edge illumination receiving surface equivalent to Brewster's angle.

20. The method of claim 19 in which said step (d) removes components of solar energy from said concentration light path above said bandgap energy wavelength by effecting a frequency shift thereof.

21. The method of claim 20 in which said frequency shift is carried out with luminescence, phosphorescence or fluorescence.

22. The method of claim 17 in which said step (e) is carried out with a dichroic device removing solar energy corresponding with wavelengths greater than said bandgap energy wavelength.

23. The method of claim 17 in which said step (a) wavelength defined band of useful energy extends from said bandgap energy wavelength to about one-half said bandgap energy wavelength.

24. The method of claim 17 in which said step (d) is carried out with a prism.

25. The method of claim 17 in which:
said step (b) is carried out with a mirror implemented primary concentrator reflecting solar radiation to define said concentration light path.

26. The method of claim 17 in which said step (d) sloping internal reflecting surface is provided as an inwardly depending logarithmically defined surface.

27. The method of claim 17 in which said step (d) secondary concentrator sloping internal surface is provided as an inwardly sloping surface having a slope angle of about 7° to about 12° with respect to said centrally disposed axis.

28. The method of claim 17 in which:
said step (e) is at least partially carried out by providing said internally reflecting surface of said secondary concentrator as a dichroic device.

29. The method of claim 28 in which said step (d) sloping internal reflecting surface is provided as an inwardly depending logarithmically defined surface.

30. The method of claim 28 in which said step (d) secondary concentrator sloping internal surface is provided as an inwardly sloping surface having a slope angle of about 7° to about 12° with respect to said centrally disposed axis.

31. The method of claim 17 in which:
said step (b) is carried out with a spherical mirror implemented primary concentrator imaging solar radiation as a coma of light distribution, and a coma corrector lens imaging said coma of light distribution at an image focal point defining said concentration light path.

32. The method of claim 17 in which:
said step (a) provides more than one said multijunction photovoltaic cell, each said cell being formed of a unique photovoltaic material exhibiting a unique bandgap energy wavelength and a corresponding unique wavelength defined band of useful energy;
said step (d) removes components of solar energy effective to substantially match said unique bandgap energy wavelength and corresponding unique wavelength defined band of useful energy to derive corresponding unique concentration light paths; and
said step (c) directs each said unique corrected concentration light path to the receiving surface of a corresponding unique cell.

33. The method of claim 32 in which:
said steps (b) and (e) are carried out by providing more than one primary concentrator component, each comprising a transparent mirror component with a unique reflective dichroic component.

34. The method of claim 33 in which said step (b) is carried out with more than one transparent Fresnel lens component having parabolic concentrator attributes.

35. The method of claim 34 in which:
said step (b) is carried out with more than one forwardly disposed transparent Fresnel pattern having a given concentrator configuration each having a corresponding rearwardly disposed transparent and complementary pattern configuration effective to support said unique reflective dichroic component in mirror defining relationship with a corresponding said forwardly disposed transparent Fresnel pattern.

36. The method of claim 33 in which said step (b) is carried out with more than one transparent parabolic mirror.

37. The method of claim 33 in which said steps (b) and (e) provide said more than one primary concentrator components in mutually spaced relationship.

* * * * *